United States Patent
Kogure

(10) Patent No.: US 10,576,890 B2
(45) Date of Patent: Mar. 3, 2020

(54) OPTICAL SOURCE UNIT BY POLARIZED LIGHT BEAMS AND VEHICLE LIGHTING APPARATUS USING THE SAME

(71) Applicant: Stanley Electric Co., Ltd., Tokyo (JP)

(72) Inventor: Shinya Kogure, Kanagawa (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/945,275

(22) Filed: Apr. 4, 2018

(65) Prior Publication Data

US 2018/0281678 A1    Oct. 4, 2018

(30) Foreign Application Priority Data

Apr. 4, 2017 (JP) ................ 2017-074182

(51) Int. Cl.

| | |
|---|---|
| *F21S 41/30* | (2018.01) |
| *F21S 41/135* | (2018.01) |
| *B60Q 11/00* | (2006.01) |
| *F21S 41/64* | (2018.01) |
| *F21S 41/20* | (2018.01) |
| *F21S 41/16* | (2018.01) |

(Continued)

(52) U.S. Cl.
CPC .......... *B60Q 11/005* (2013.01); *F21S 41/135* (2018.01); *F21S 41/14* (2018.01); *F21S 41/16* (2018.01); *F21S 41/285* (2018.01); *F21S 41/30* (2018.01); *F21S 41/645* (2018.01); *F21S 41/675* (2018.01); *H01S 5/06825* (2013.01); *H01S 5/4012* (2013.01); *F21Y 2115/30* (2016.08); *H01S 5/005* (2013.01); *H01S 5/32341* (2013.01); *H01S 5/4093* (2013.01)

(58) Field of Classification Search
None
See application file for complete search history.

(56) References Cited

U.S. PATENT DOCUMENTS

| | | | | |
|---|---|---|---|---|
| 5,404,365 A | * | 4/1995 | Hiiro .................. | H01S 3/2383 372/106 |
| 7,136,588 B1 | * | 11/2006 | Islam .................. | G02B 6/3514 398/83 |

(Continued)

FOREIGN PATENT DOCUMENTS

| | | |
|---|---|---|
| EP | 3124852 A1 | 2/2017 |
| JP | 2001-266620 A | 9/2001 |

(Continued)

OTHER PUBLICATIONS

The extended European Search Report for the related European Patent Application No. 18165526.7 dated Aug. 30, 2018.

*Primary Examiner* — John F Mortell
(74) *Attorney, Agent, or Firm* — Kenealy Vaidya LLP

(57) ABSTRACT

An optical source unit includes a first optical source for emitting a P-polarized light beam, a first detector for detecting whether the first optical source is normal or abnormal, a second optical source for emitting an S-polarized light beam, a second detector for detecting whether the second optical source is normal or abnormal, and a light beam combining section including a polarization beam splitter for transmitting the P-polarized light beam and reflecting the S-polarized light beam to combine the P-polarized light beam and the S-polarized light beam into an output light beam of the optical source unit.

8 Claims, 14 Drawing Sheets

(51) Int. Cl.
    *F21S 41/675*     (2018.01)
    *H01S 5/068*     (2006.01)
    *F21S 41/14*     (2018.01)
    *H01S 5/40*     (2006.01)
    H01S 5/323     (2006.01)
    F21Y 115/30     (2016.01)
    H01S 5/00     (2006.01)

(56) References Cited

U.S. PATENT DOCUMENTS

| | | | | |
|---|---|---|---|---|
| 7,295,371 B1* | 11/2007 | Sedlmayr | ............... | G02B 26/02 359/489.07 |
| 2007/0009010 A1* | 1/2007 | Shio | ............... | G01K 11/125 374/161 |
| 2016/0004221 A1* | 1/2016 | Ayres | ............... | G03H 1/2645 359/22 |

FOREIGN PATENT DOCUMENTS

| | | |
|---|---|---|
| JP | 2004-210131 A | 7/2004 |
| JP | 2013-168586 A | 8/2013 |
| JP | 2016-085795 A | 5/2016 |

\* cited by examiner

OPTICAL SOURCE UNIT BY POLARIZED LIGHT BEAMS AND VEHICLE LIGHTING APPARATUS USING THE SAME

This application claims the priority benefit under 35 U.S.C. § 119 to Japanese Patent Application No. JP2017-074182 filed on Apr. 4, 2017, which disclosure is hereby incorporated in its entirety by reference.

BACKGROUND

Field

The presently disclosed subject matter relates to an optical source unit and a vehicle lighting apparatus using the optical source unit.

Description of the Related Art

Recently, in a vehicle lighting apparatus such as a headlight, in order to miniaturize an optical source unit and improve its far visibility characteristics, laser diode (LD) elements have remarkably been noticed as highly luminous optical sources.

A first prior art optical source unit is constructed by a single laser diode element to cover the whole light distribution pattern (see: JP2016-85795A), and a second prior art optical source unit is constructed by multiple laser diode elements each covering a partial light distribution pattern for one of divided regions (see: JP2001-266620A). In JP2001-266620A, note that multiple light emitting diode (LED) elements are actually provided in an optical source unit; however, such LED elements can be replaced by laser diode elements.

In the above-described first and second prior art optical source units, however, if an excessive current flows through one of the laser diode elements, a catastrophic optical damage (COD) phenomenon would occur therein to suddenly reduce its optical output. As a result, in the first prior art optical source unit, the whole light distribution pattern is blacked out, which would be very risky. On the other hand, in the second prior art optical source unit, the partial light distribution pattern corresponding to the COD phenomenon-occurred laser diode element is blacked out, which would destroy the light distribution. Thus, in the first and second prior art optical source units, an obstacle would be generated in a night driving state.

SUMMARY

The presently disclosed subject matter seeks to solve the above-described problems.

According to the presently disclosed subject matter, an optical source unit includes a first optical source for emitting a P-polarized light beam, a first detector for detecting whether the first optical source is normal or abnormal, a second optical source for emitting an S-polarized light beam, a second detector for detecting whether the second optical source is normal or abnormal, and a light beam combining section including a polarization beam splitter for transmitting the P-polarized light beam and reflecting the S-polarized light beam to combine the P-polarized light beam and the S-polarized light beam into an output light beam of the optical source unit.

Also, a vehicle lighting apparatus includes the above-mentioned optical source unit, a projection optical unit for receiving the output light beam to project the output light beam, and a control unit for controlling the optical source unit. When the first and second optical sources are determined to be both normal in accordance with first and second output signals of the first and second detectors, respectively, the control unit is adapted to drive one of the first and second optical source units, so that the output light beam of the optical source unit has a predetermined light flux. When one of the first and second optical sources is determined to be normal and the other of the first and second optical sources is determined to be abnormal in accordance with the first and second output signals of the first and second detectors, respectively, the control unit is adapted to drive the one of the first and second optical source units, so that the output light beam of the optical source unit has the predetermined light flux.

Further, a vehicle lighting apparatus includes the above-mentioned optical source unit, a projection optical unit for receiving the output light beam to project the output light beam; and a control unit for controlling the optical source unit. When the first and second optical sources are determined to be both normal in accordance with first and second output signals of the first and second detectors, respectively, the control unit is adapted to drive both of the first and second optical source units, so that the output light beam of the optical source unit has a predetermined light flux. When one of the first and second optical sources is determined to be normal and the other of the first and second optical sources is determined to be abnormal in accordance with the first and second output signals of the first and second detectors, respectively, the control unit is adapted to drive the one of the first and second optical source units, so that the output light beam of the optical source unit has the predetermined light flux.

According to the presently disclosed subject matter, when at least one of the first and second optical sources is determined to be normal, the output light beam of the optical source unit can have a predetermined light flux, so that even if a COD phenomenon occurs in one of the first and second optical sources, the light distribution is never destroyed, which would not generate an obstacle in a night driving state.

BRIEF DESCRIPTION OF THE DRAWINGS

The above and other advantages and features of the presently disclosed subject matter will be more apparent from the following description of certain embodiments, taken in conjunction with the accompanying drawings, wherein.

DETAILED DESCRIPTION OF EXEMPLARY EMBODIMENTS

Figure 1:
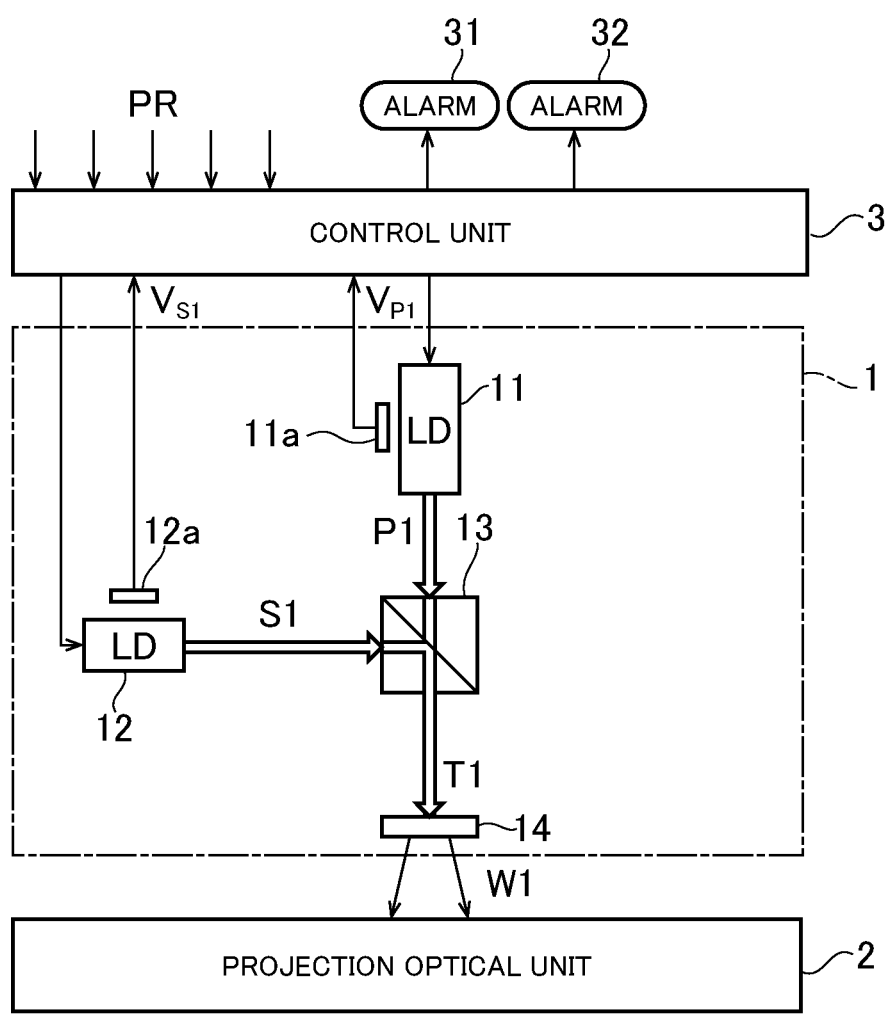
FIG. 1 is a block diagram illustrating a vehicle lighting apparatus including a first embodiment of the optical source unit according to the presently disclosed subject matter.

In FIG. 1, which illustrates a vehicle lighting apparatus including a first embodiment of the optical source unit according to the presently disclosed subject matter, an optical source unit 1 is controlled by a control unit 3 to emit a white light beam W1 to a projection optical unit 2 which projects the white light beam W1 onto a focus face (not shown).

The optical source unit 1 is constructed by a single main optical source 11 for emitting a horizontally-polarized (P-polarized) light beam P1, a sub optical source 12 for emitting a vertically-polarized (S-polarized) light beam S1, a light beam combining section 13 with an output beam path along with the P-polarized light beam P1, and a wavelength converting member 14. Also, provided at the main optical source 11 and the sub optical source 12 are a main detector 11a and a sub detector 12a, respectively.

Each of the optical sources 11 and 12 is constructed by a laser diode element for emitting a light beam with a predetermined wavelength such as a blue light beam. The P-polarized light beam P1 of the main optical source 11 and the S-polarized light beam S1 of the sub optical source 12 are orthogonal to each other at the light beam combining section 13. Note that when the laser diode element does not emit a linearly-polarized light beam, a polarizer or a polarizing element such as a polarizing converter (PLC) for converting a circularly-polarized light beam into a linearly-polarized light can be added to the post-stage of the laser diode element.

The main detector 11a is adapted to detect a light emitting state of the main optical source 11, while the sub detector 12a is adapted to detect a light emitting state of the sub optical source 12. Each of the detectors 11a and 12a is constructed by a photodiode for detecting the P-polarized light beam P1 and the S-polarized light beam S1, respectively, or a resistance for detecting a current flowing through the main optical source 11 and the sub optical source 12, respectively. When the sense signal $V_{P1}$ of the main detector 11a or the sense signal $V_{S1}$ of the sub detector 12a is larger than a predetermined value, the control unit 3 determines that the main optical source 11 or the sub optical source 12 is normal. Otherwise, the control unit 3 determines that the main optical source 11 or the sub optical source 12 is determined to be abnormal due to the COD phenomenon or the like.

The light beam combining section 13 includes a polarization beam splitter which is constructed by alternately-laminated low-refractive layers and high-reflective layers sandwiched by two triangular prisms. The polarization beam splitter transmits P-polarized light beams of the predetermined wavelength therethrough, while the polarization beam splitter reflects S-polarized light beams of the predetermined wavelength, so that transmitted P-polarized light beams and reflected S-polarized light beams are combined at the output of the polarization beam splitter.

The output light beam T1 at the light beam combining section 13, which is the P-polarized light beam P1 or the S-polarized light beam S1, is transmitted to the wavelength converting member 14, in order to convert the output light beam T1 into the white light beam W1. That is, the wavelength converting member 14 includes phosphor particles such as yttrium-aluminum-garnet (YAG) particles for converting a part of the output light beam T1 into a wavelength-converted light component such as a yellow light component with a longer wavelength, thereby mixing a light component directly from the output light beam T1 with the wavelength-converted light into desired light such as the white light beam W1. Note that, when the main optical source 11 and the sub optical source 12 are constructed by red, green and blue (RGB) laser sources for emitting white light, the wavelength converting member 14 can be omitted.

The white light beam W1 is transmitted to the projection optical unit 2 which is constructed by a convex lens or the like.

The control unit 3 is constructed by a microcomputer or the like which receives various driving state parameter signals PR such as the outputs of a headlight switch, a low/high beam switch, an infrared camera, a radar, a vehicle speed sensor, a steering angle sensor and so on to control the main optical source 11 and the sub optical source 12. In this case, when the main optical source 11 or the sub optical source 12 is determined to be abnormal, the control unit 3 turns on an alarm 31 or 32, which is informed to the driver.

Figure 2:
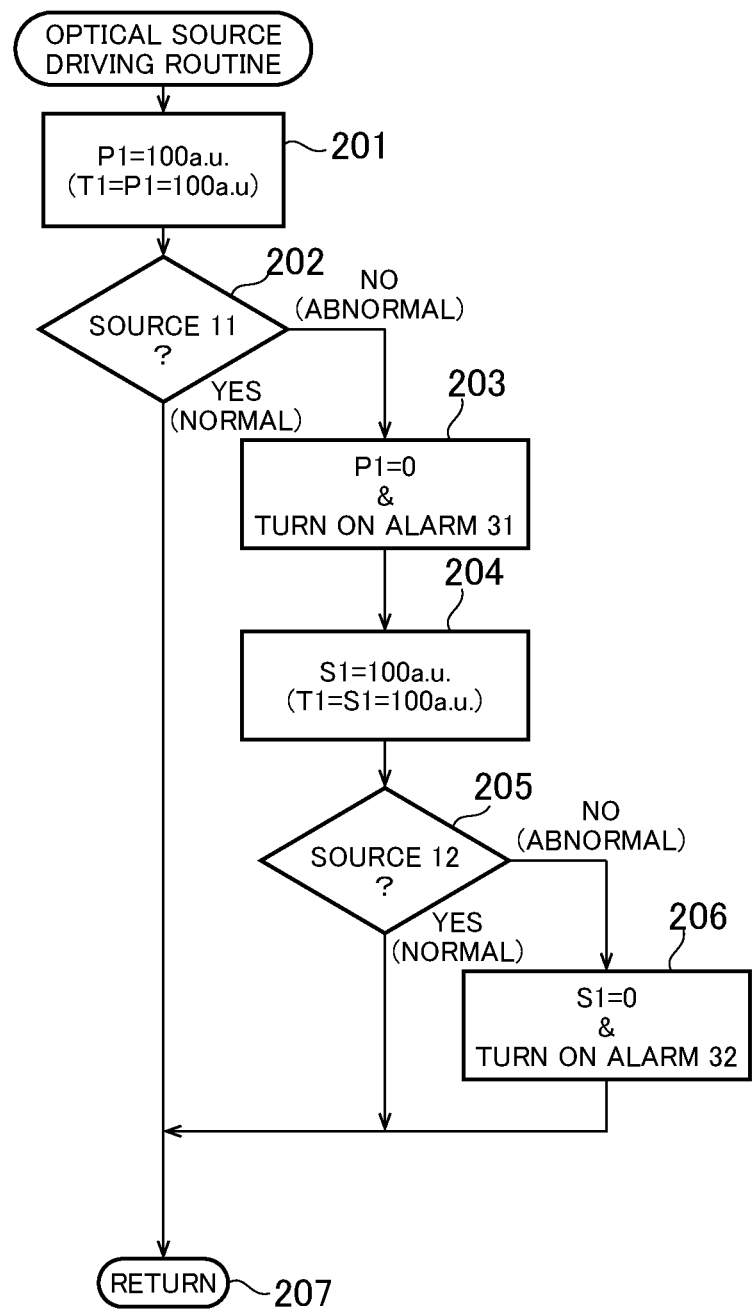
FIG. 2 is a flowchart for explaining a first operation of the control unit of FIG. 1.

A first operation of the control unit 3 of FIG. 1 will be explained with reference to FIG. 2. The optical source driving routine of FIG. 2 is started in accordance with the driving state parameters PR. Here, note that the light fluxes of the light beams P1, S1, . . . are also represented by P1, S1, . . . . Further, an expected light flux (predetermined light flux) T1 is 100 a.u.

First, at step 201, the main optical source 11 is driven to emit the predetermined light flux of 100 a.u. That is, $P1=100$ a.u.

As a result, the output light beam T1 of the light beam combining section 13 is expected to have the predetermined light flux:

$T1=P1=100$ a.u.

Next, at step 202, it is determined whether the main optical source 11 is normal or abnormal in accordance with the sense signal $V_{P1}$ of the main detector 11a. As a result, when the sense signal $V_{P1}$ of the main detector 11a is larger than the predetermined value, so that the main optical source 11 is determined to be normal, the control proceeds directly to step 207. Otherwise, the control proceeds via steps 203 through 206 to step 207.

At step 203, the control unit 3 turns off the main optical source 11, i.e., P1=0, and turns on the alarm 31 which is informed to the driver.

Next, at step 204, the sub optical source 12 is driven to emit the predetermined light flux of 100 a.u. That is, $$S1=100 \text{ a.u.}$$

As a result, the output light beam T1 of the light beam combining section 13 is expected to have the predetermined light flux:

$$T1=S1=100 \text{ a.u.}$$

Next, at step 205, it is determined whether the sub optical source 12 is normal or abnormal in accordance with the sense signal $V_{S1}$ of the sub detector 12$a$. As a result, when the sense signal $V_{S1}$ of the sub detector 12$a$ is larger than the predetermined value, so that the sub optical source 12 is determined to be normal, the control proceeds directly to step 207. Otherwise, the control proceeds via step 206 to step 207.

At step 206, the control unit 3 turns off the sub optical source 12, i.e., S1=0, and turns on the alarm 32 which is informed to the driver. Then, the control proceeds to step 207.

Thus, according to the first operation of the control unit 3 as illustrated in FIG. 2, when the optical sources 11 and 12 are determined to be both normal, only one of them is driven to emit the predetermined light flux such as 100 a.u. Also, when one of the optical sources 11 and 12 is determined to be normal and the other is determined to be abnormal, only the normal optical source is driven to emit the predetermined light flux such as 100 a.u. Therefore, in any case, the light beam combining section 13 emits the predetermined light flux such as 100 a.u. In this case, the abnormal state of the optical source 11 or 12 is informed by the alarm 31 or 32 to the driver. Note that if the optical sources 11 and 12 are determined to be both abnormal, their abnormal states are informed by both of the alarms 31 and 32 to the driver.

Figure 3:
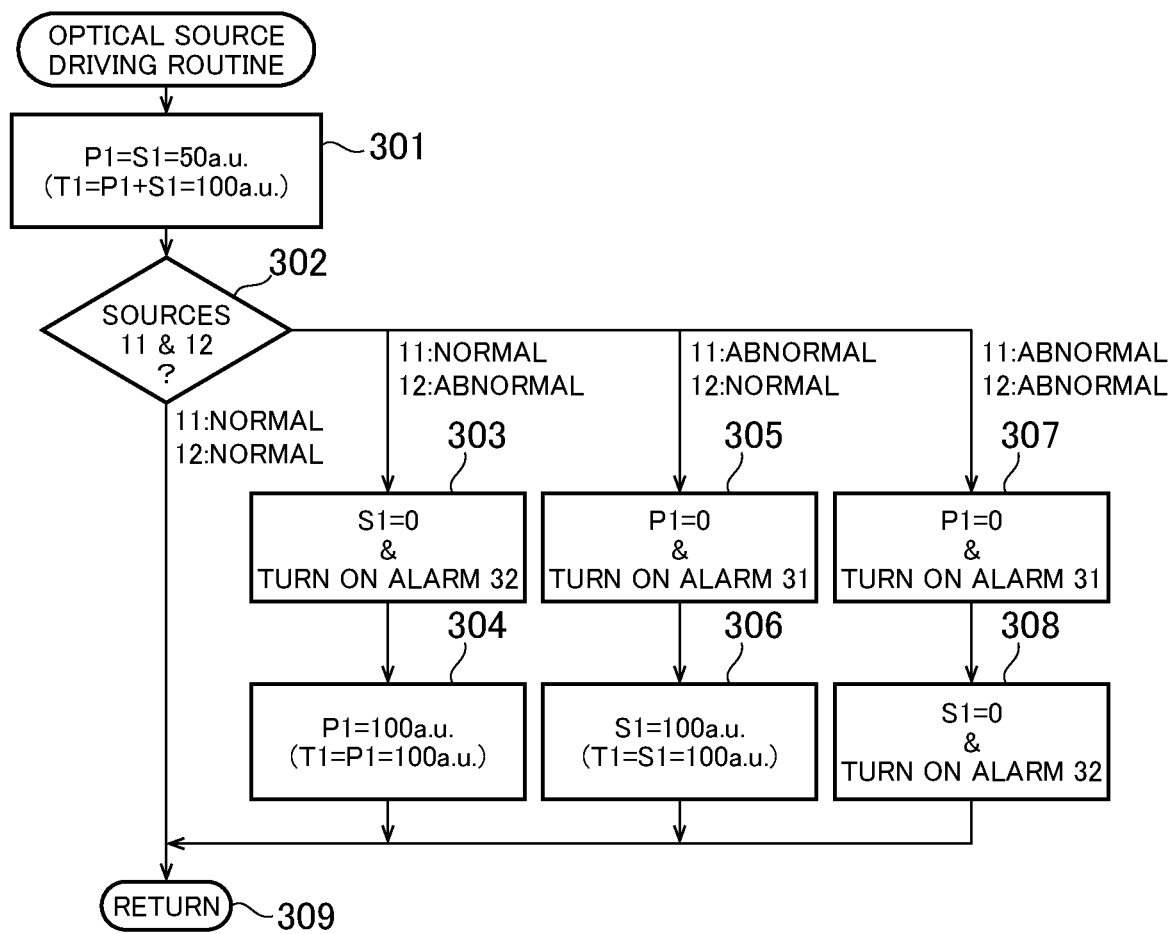
FIG. 3 is a flowchart for explaining a second operation of the control unit of FIG. 1.

A second operation of the control unit 3 of FIG. 1 will be explained with reference to FIG. 3. The optical source driving routine of FIG. 3 is started in accordance with the driving state parameters PR. Here, note that the light fluxes of the light beams P1, S1, . . . are also represented by P1, S1, . . . . Further, an expected light flux (predetermined light flux) T1 is 100 a.u.

First, at step 301, each of the main optical source 11 and the sub optical source 12 is driven to emit a light flux of 50 a.u. which is half of the predetermined light flux of 100 a.u. That is, $$P1=S1=50 \text{ a.u.}$$

As a result, the output light beam T1 of the light beam combining section 13 is expected to have the predetermined light flux:

$$T1=P1+S1=100 \text{ a.u.}$$

Next, at step 302, it is determined whether the main optical source 11 and the sub optical source 12 are normal or abnormal in accordance with the sense signal $V_{P1}$ of the main detector 11$a$ and the sense signal $V_{S1}$ of the sub detector 12$a$. As a result, when the sense signal $V_{P1}$ of the main detector 11$a$ and the sense signal $V_{S1}$ of the sub detector 12 are both larger than the predetermined value, so that the main optical source 11 and the sub detector 12$a$ are determined to be normal, the control proceeds directly to step 309. Also, when the main optical source 11 and the sub optical source 12 are determined to be normal and abnormal, respectively, the control proceeds via steps 303 and 304 to step 309. Further, when the main optical source 11 and the sub optical source 12 are determined to be abnormal and normal, respectively, the control proceeds via steps 305 and 306 to step 309. Furthermore, when the main optical source 11 and the sub optical source 12 are determined to be both abnormal, the control proceeds via steps 307 and 308 to step 309.

Steps 303 and 304 will now be explained. At step 303, the abnormal sub optical source 12 is turned off, i.e., S1=0, and the alarm 32 is turned on, which is informed to the driver. Next, at step 304, the light flux of the normal main optical source 11 is increased to the predetermined light flux such as 100 a.u. That is, $$P1=100 \text{ a.u.}$$

Therefore, the output light beam T1 of the light beam combining section 13 is expected to be the predetermined light flux:

$$T1=P1=100 \text{ a.u.}$$

Then, the control proceeds to step 309.

Steps 305 and 306 will now be explained. At step 305, the abnormal main optical source 11 is turned off, i.e., P1=0, and the alarm 31 is turned on, which is informed to the driver. Next, at step 306, the light flux of the normal sub optical source 12 is increased to the predetermined light flux such as 100 a.u. That is, $$S1=100 \text{ a.u.}$$

Therefore, the output light beam T1 of the light beam combining section 13 is expected to have the predetermined light flux:

$$T1=S1=100 \text{ a.u.}$$

Then, the control proceeds to step 309.

Steps 307 and 308 will now be explained. At step 307, the abnormal main optical source 11 is turned off, i.e., P1=0, and the alarm 31 is turned on, which is informed to the driver. Next, at step 308, the abnormal sub optical source 12 is turned off, i.e., S1=0, and the alarm 32 is turned on, which is informed to the driver. Then, the control proceeds to step 309.

Thus, according to the second operation of the control unit 3 as illustrated in FIG. 3, when the main optical source 11 and the sub optical source 12 are determined to be both normal, the combined light beam T1 of the light beam combining section 13 has the predetermined light flux such as 100 a.u. by combining the output light fluxes of the main optical source 11 and the sub optical source 12 which are 50 a.u. for example. In this case, since the sub optical source 12 is driven, the output of the main optical source 11 can be decreased to prevent a COD phenomenon from being generated therein. On the other hand, when one of the optical sources 11 and 12 is determined to be normal and the other is determined to be abnormal, the combined light beam T1 of the light beam combining section 13 has the predetermined light flux of 100 a.u. by increasing the output light flux of the normal light source to the predetermined light flux, while the abnormal optical source is turned off. In this case, since the optical path length between the main optical source 11 and the light beam combining section 13 is almost the same as optical path length between the sub optical source 12 and the light beam combining section 13, the light energy density distribution is unchanged even when the main optical source 11 and the sub optical source 12 are switched, to suppress the destruction of the light distribution. Further, when the optical sources 11 and 12 are determined to be both abnormal, the alarms 31 and 32 are both turned on, which is informed to the driver.

Figure 4:
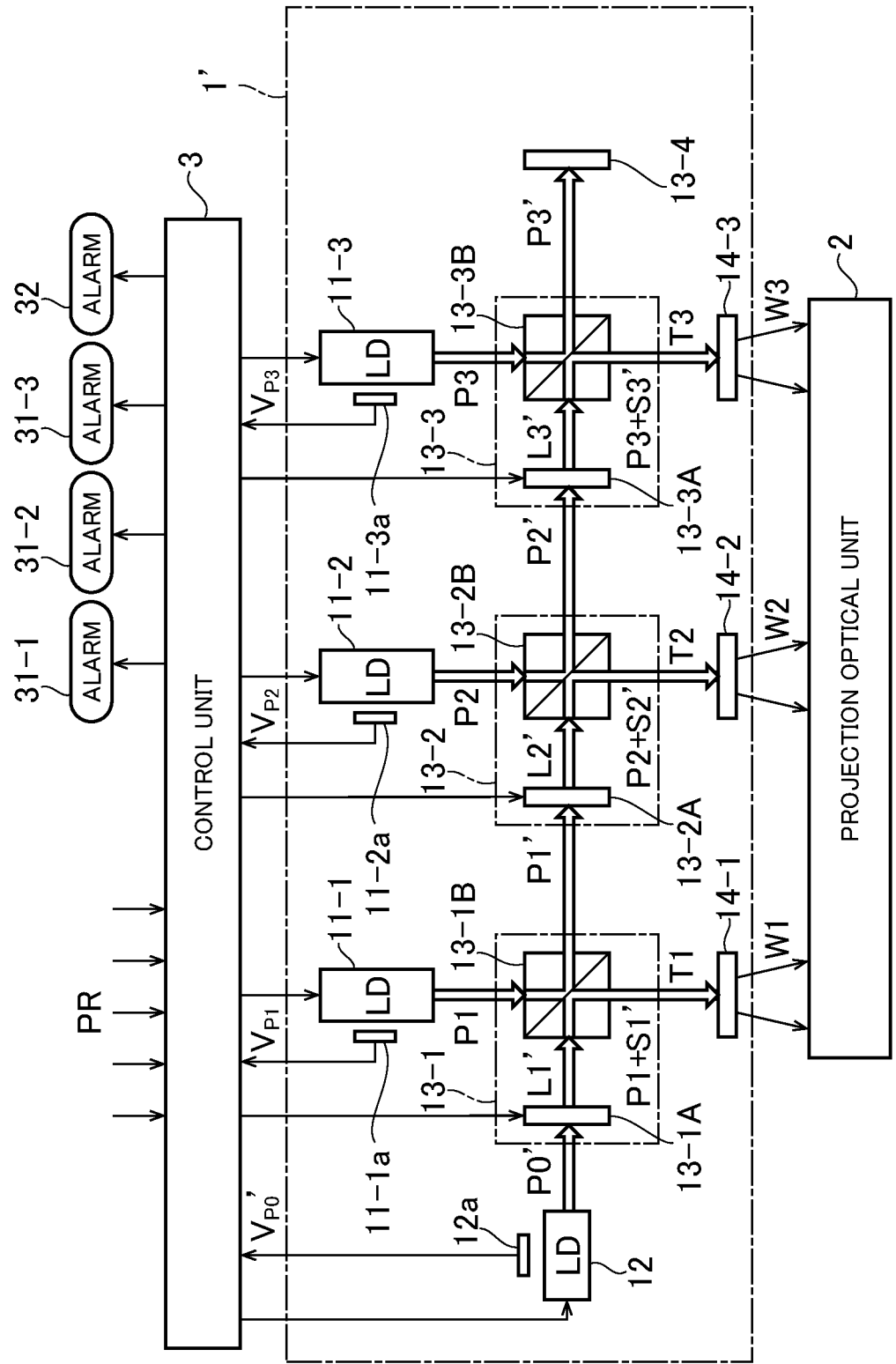
FIG. 4 is a block diagram illustrating a vehicle lighting apparatus including a second embodiment of the optical source unit according to the presently disclosed subject matter.

In FIG. 4, which illustrates a vehicle lighting apparatus including a second embodiment of the optical source unit according to the presently disclosed subject matter, the optical source unit 1 of FIG. 1 is replaced by a one-dimensional optical source unit 1'.

In the one-dimensional optical source unit 1', multiple main optical sources such as three main optical sources 11-1, 11-2 and 11-3 for emitting P-polarized light beams P1, P2 and P3, respectively, are provided instead of the single main optical source 11 of FIG. 1. In this case, the main optical sources 11-1, 11-2 and 11-3 are associated with main detectors 11-1a, 11-2a and 11-3a similar to the main detector 11a of FIG. 1. Also, the sub optical source 12 emits a P-polarized light beam P0' instead of the S-polarized light beam S1 of FIG. 1.

In the one-dimensional optical unit 1', three light beam combining and splitting sections 13-1, 13-2 and 13-3 are provided instead of the light beam combining section 13 of FIG. 1. The light beam combining and splitting sections 13-1, 13-2 and 13-3 are serially located at the output light path of the sub optical source 12 and also, receive the P-polarized light beams P1, P2 and P3, respectively. The output light beams T1, T2 and T3 of the light beam combining and splitting sections 13-1, 13-2 and 13-3 are supplied to wavelength converting members 14-1, 14-2 and 14-3, respectively, similar to the wavelength converting member 14 of FIG. 1. Further, provided at the terminal of the light beam combining and splitting sections 13-1, 13-2 and 13-3 is a light shield member 13-4.

The control unit 3 is connected to three alarms 31-1, 31-2 and 31-3 corresponding to the main detectors 11-1a, 11-2a and 11-3a, respectively.

Each of the light beam combining and splitting sections 13-1, 13-2 and 13-3 is constructed by a variable polarization element 13-1A, 13-2A or 13-3A and a polarization beam splitter 13-1B, 13-2B or 13-3B. The variable polarization element 13-1A is controlled by the control unit 3 to change the polarization state of the P-polarized light beam P0' of the sub optical source 12 by an amount indicated by the control unit 3 to emit a polarization light beam L1'. The variable polarization element 13-2A is controlled by the control unit 3 to change the polarization state of the P-polarized light beam P1' of the light beam combining and splitting element 13-1 by an amount indicated by the control unit 3 to emit a polarization beam L2'. The variable polarization element 13-3A is controlled by the control unit 3 to change the polarization state of the P-polarized light beam P2' of the light beam combining and splitting element 13-2 by an amount indicated by the control unit 3 to emit a polarization beam L3'.

The polarization beam splitter 13-1B (13-2B, 13-3B) splits the polarization light beam L1'(L2', L3') emitted from the variable polarization element 13-1A(13-2A, 13-3A) into a P-polarized component P1'(P2', P3') and an S-polarized component S1'(S2', S3'). That is, $$L1'=P1'+S1'$$

$$L2'=P2'+S2'$$

$$L3'=P3'+S3'$$

In this case, the light flux ratio of the P-polarized light beam P1'(P2', P3') to the S-polarized light beam S1'(S2', S3') at the polarization beam combining and splitting element 13-1B (13-2B, 13-3B) is determined by the polarization state of the emitted light beam of the variable polarization element 13-1A(13-2A, 13-3A).

The polarization beam splitter 13-B(13-2B, 13-3B) transmits the P-polarized component P1'(P2', P3') to the next stage light beam combining and splitting section or the light shield member 13-4. Note that the P-polarized light beam P3' is absorbed by the light shield element 13-4, and therefore, is not emitted from the optical source unit 1'. Simultaneously, the polarization beam splitter 13-1B(13-2B, 13-3B) combines the P-polarized light beam P1(P2, P3) of the main optical source 11-1(11-2, 11-3) with the S-polarized component S1'(S2', S3') of the polarization light beam L1'(L2', L3') emitted from the variable polarization element 13-1A(13-2A, 13-3A) to emit a light beam T1(T2, T3) for the projection optical unit 2.

Each of the variable polarization elements 13-1A, 13-2A and 13-3A is constructed by a wave plate with a phase difference larger than a half wavelength of the light beams P1, P2, P3 and P0' and a piezoelectric actuator controlled by the control unit 3 to change the optical axis of the wave plate. Also, each of the variable polarization elements 13-1A, 13-2A and 13-3A can be constructed by a Farady rotator for rotating a linearly-polarized light beam in accordance with a magnetic field and an electromagnet controlled by the control unit 3 to generate the above-mentioned magnetic field. Further, each of the variable polarization elements 13-1A, 13-2A and 13-3A can be constructed by a liquid crystal element and a liquid crystal driver circuit controlled by the control unit 3 to drive the liquid crystal element.

The output light beams T1, T2 and T3 from the polarization beam splitters 13-1B, 13-2B and 13-3B are supplied to the wavelength converting elements 14-1, 14-2 and 14-3 including YAG phosphor particles, for example, which are separate from each other. The output light beams T1, T2 and T3 which are blue light, for example, are converted by the wavelength converting elements 14-1, 14-2 and 14-3 into white light beams W1, W2 and W3 which are further transmitted to the projection optical unit 2 formed by a convex lens or the like. Note that if the wavelength converting elements 14-1, 14-2 and 14-3 are formed by one wavelength converting element, the white light beams W1, W2 and W3 interfere with each other, which is not advantageous. Note that, when the main optical sources 11-1, 11-2 and 11-3 and the sub optical source 12 are constructed by red, green and blue (RGB) laser sources for emitting white light, the wavelength converting member 14-1, 14-2 and 14-3 can be omitted.

Thus, an arbitrary ratio of the light fluxes of the S-polarized light beams S1', S2' and S3' incident to the polarization beam splitters 13-1B, 13-2B and 13-3B can be adjusted in accordance with the polarization states of the output polarization light beams L1', L2' and L3' of the variable polarization elements 13-1A, 13-2A and 13-3A controlled by the control unit 3. In this case, $$P0'=S1'+S2'+S3'$$

Figure 5:
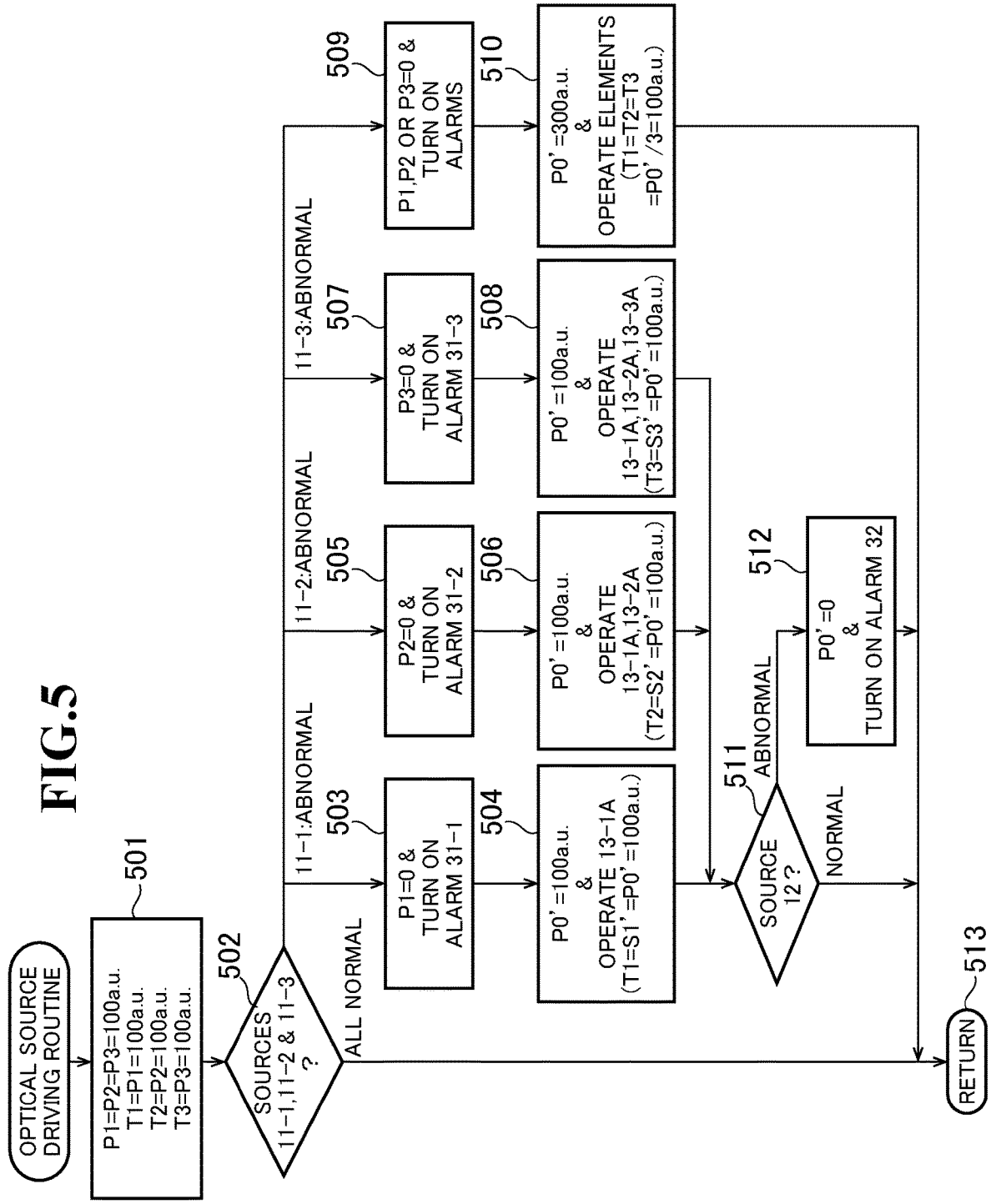
FIG. 5 is a flowchart for explaining a first operation of the control unit of FIG. 4.

A first operation of the control unit 3 of FIG. 4 will be explained with reference to FIG. 5. The optical source driving routine of FIG. 5 is started in accordance with the driving state parameters PR. Here, note that the light fluxes of the light beams P1, S1, . . . are also represented by P1, S1, . . . . Further, an expected light flux (predetermined light flux) T1, T2 or T3 is 100 a.u.

First, at step 501, the main optical sources 11-1, 11-2 and 11-3 are driven to emit the predetermined light flux of 100 a.u. That is, $$P1=100 \text{ a.u.}$$

$$P2=100 \text{ a.u.}$$

$$P3=100 \text{ a.u.}$$

As a result, the output light beams T1, T2 and T3 of the light beam combining and splitting section 13-1, 13-2 and 13-3 are expected to have the predetermined light flux:

$$T1=P1=100 \text{ a.u.}$$

$$T2=P2=100 \text{ a.u.}$$

$$T3=P3=100 \text{ a.u.}$$

Next, at step 502, it is determined whether the main optical sources 11-1, 11-2 and 11-3 are normal or abnormal in accordance with the sense signals $V_{P1}$, $V_{P2}$ and $V_{P3}$ of the main detectors 11-1a, 11-2a and 11-3a. As a result, when the sense signals $V_{P1}$, $V_{P2}$ and $V_{P3}$ of the main detectors 11-1a, 11-2a and 11-3a of the main detectors 11-1a, 11-2a and 11-3a are larger than the predetermined value, so that the main optical sources 11-1, 11-2 and 11-3 are determined to be normal, the control proceeds directly to step 513. Only when the main optical source 11-1 is determined to be abnormal, does the control proceed via steps 503, 504, 511 and 512 to step 513. Only when the main optical source 11-2 is determined to be abnormal, does the control proceed via steps 505, 506, 511 and 512 to step 513. Only when the main optical source 11-3 is determined to be abnormal, does the control proceeds via steps 507, 508, 511 and 512 to step 513. When two or three of the main optical sources 11-1, 11-2 and 11-3 are determined to be abnormal, the control proceeds via steps 509, 510, 511 and 512 to step 513.

Steps 503 and 504 will now be explained. At step 503, the control unit 3 turns off the main optical source 11-1, i.e. P1=0, and turns on the alarm 31-1 which is informed to the driver. Next, at step 504, the sub optical source 12 is driven to emit the predetermined light flux of 100 a.u. That is, $$P0'=100 \text{ a.u.}$$

Further, at the light beam combining and splitting section 13-1, the variable polarization element 13-1A is operated by the control unit 3 to convert the P-polarized light beam P0' of the sub optical source 12 into an S-polarized light beam S1'. That is, $$L1'=S1'$$

As a result, the output light beam T1 of the polarization beam splitter 13-1B is expected to have the predetermined light flux:

$$T1=S1'=P0'=100 \text{ a.u.}$$

Therefore, P1'=P2'=P3'=0

Thus, the sub optical source 12 serves as the main optical source 11-1. Then, the control proceeds to steps 511 and 512.

Steps 505 and 506 will now be explained. At step 505, the control unit 3 turns off the main optical source 11-2, i.e. P2=0, and turns on the alarm 31-2 which is informed to the driver. Next, at step 506, the sub optical source 12 is driven to emit the predetermined light flux of 100 a.u. That is, $$P0'=100 \text{ a.u.}$$

Further, at the light beam combining and splitting section 13-1, the variable polarization element 13-1A is operated by the control unit 3 to transmit the P-polarized light beam P0' of the sub optical source 12 therethrough. That is, $$L1'=P0'$$

As a result, the light flux P1' of the polarization beam splitter 13-1B is expected to satisfy:

$$P1'=P0'$$

Further, at the light beam combining and splitting section 13-2, the variable polarization element 13-2A is operated by the control unit 3 to convert the P-polarized light beam P1' into an S-polarized light beam S2'. That is, $$L2'=S2'$$

As a result, the output light beam T2 of the polarization beam splitter 13-2B is expected to have the predetermined light flux:

$$T2=S2'=P0'=100 \text{ a.u.}$$

Therefore, P2'=P3'=0

Thus, the sub optical source 12 serves as the main optical source 11-2. Then, the control proceeds to steps 511 and 512.

Steps 507 and 508 will now be explained. At step 507, the control unit 3 turns off the main optical source 11-3, i.e. P3=0, and turns on the alarm 31-3 which is informed to the driver. Next, at step 508, the sub optical source 12 is driven to emit the predetermined light flux of 100 a.u. That is, $$P0'=100 \text{ a.u.}$$

Further, at the light beam combining and splitting section 13-1, the variable polarization element 13-1A is operated by the control unit 3 to transmit the P-polarized light beam P0' of the sub optical source 12 therethrough. That is, $$L1'=P0'$$

As a result, the light flux P1' of the polarization beam splitter 13-1B is expected to satisfy:

$$P1'=P0'$$

Further, at the light beam combining and splitting section 13-2, the variable polarization element 13-2A is operated by the control unit 3 to transmit the P-polarized light beam P1' of the light beam combining and splitting section 13-2 therethrough. That is, $$L2'=P1'$$

As a result, the light flux P2' of the polarization beam splitter 13-1B is expected to satisfy:

$$P2'=P0'$$

Further, at the light beam combining and splitting section 13-3, the variable polarization element 13-3A is operated by the control unit 3 to convert the P-polarized light beam P2' into an S-polarized light beam S3'. That is, $$L3'=S3'$$

As a result, the output light beam T3 of the polarization beam splitter 13-3B is expected to have the predetermined light flux:

$$T3=S3'=P0'=100 \text{ a.u.}$$

Therefore, P3'=0

Thus, the sub optical source 12 serves as the main optical source 11-3. Then, the control proceeds to steps 511 and 512.

Steps 509 and 510 will now be explained. At step 509, since two or three of the main optical sources 11-1, 11-2 and 11-3 are determined to be abnormal, the two or three of the main optical sources 11-1, 11-2 and 11-3 are turned off. For example, if the main optical sources 11-1, 11-2 and 11-3 are determined to be all abnormal, all the main optical sources 11-1, 11-2 and 11-3 are turned off, i.e., P1=P2=P3=0, and their corresponding alarms 31-1, 31-2 and 31-3 are turned on, which is informed to the driver. Next, at step 510, the sub optical source 12 is driven to emit a light flux which is the same as a total light flux of the light fluxes of the abnormal main optical sources such as 300 a.u., i.e., P0'=300 a.u., That is, the variable polarization elements 13-1A, 13-2A and 13-3A are controlled by the control unit 3 to emit S-polarized light beams S1', S2' and S3', so that the output light beams T1, T2 and T3 of the polarization beam splitters 13-1B, 13-2B and 13-3B are expected to emit the predetermined light flux:

$T1=T2=T3=100$ a.u.

In the above-mentioned case, when all the main optical sources 11-1, 11-2 and 11-3 are determined to be abnormal, the sub optical source 12 is driven at a light flux of 300 a.u. which would invite a COD phenomenon. In order to suppress generation of such a COD phenomenon in the sub optical source 12, the sub optical source 12 can be driven at a light flux of 100 a.u. while each of the output light beams T1, T2 and T3 of the polarization beam splitters 13-1B, 13-2B and 13-3B is expected to have one-third of the predetermined light flux:

$T1=T2=T3=100/3$ a.u.

Or, the sub optical source 12 can be driven at a light flux of 150 a.u. while each of the output light beams T1, T2 and T3 of the polarization beam splitters 13-1B, 13-2B and 13-3B is expected to have half of the predetermined light flux:

$T1=T2=T3=100/2=50$ a.u.

Then, the control proceeds to steps 511 and 512.

At step 511, it is determined whether the sub optical source 12 is normal or abnormal in accordance with the sense signal $V_{P0}'$ of the sub detector 12a. As a result, when the sense signal $V_{P0}'$ of the sub detector 12a is larger than the predetermined value, so that the sub optical source 12 is determined to be normal, the control proceeds directly to step 513. Otherwise, the control proceeds to step 512. At step 512, the control unit 3 turns off the sub optical source 12, i.e., P0'=0, and turns on the alarm 32 which is informed to the driver. Then, the control proceeds to step 513.

Thus, according to the first operation of the control unit 3 as illustrated in FIG. 5, when the main optical sources 11-1, 11-2 and 11-3 are determined to be all normal, each of the main optical sources 11-1, 11-2 and 11-3 is driven to emit the predetermined light flux such as 100 a.u. Also, when one or more of the main optical sources 11-1, 11-2 and 11-3 are determined to be abnormal, the normal sub optical source is driven instead of the abnormal main optical sources, and the abnormal states are informed by the alarms to the driver. Note that the predetermined light fluxes T1, T2 and T3 can be different from each other.

Figure 6:
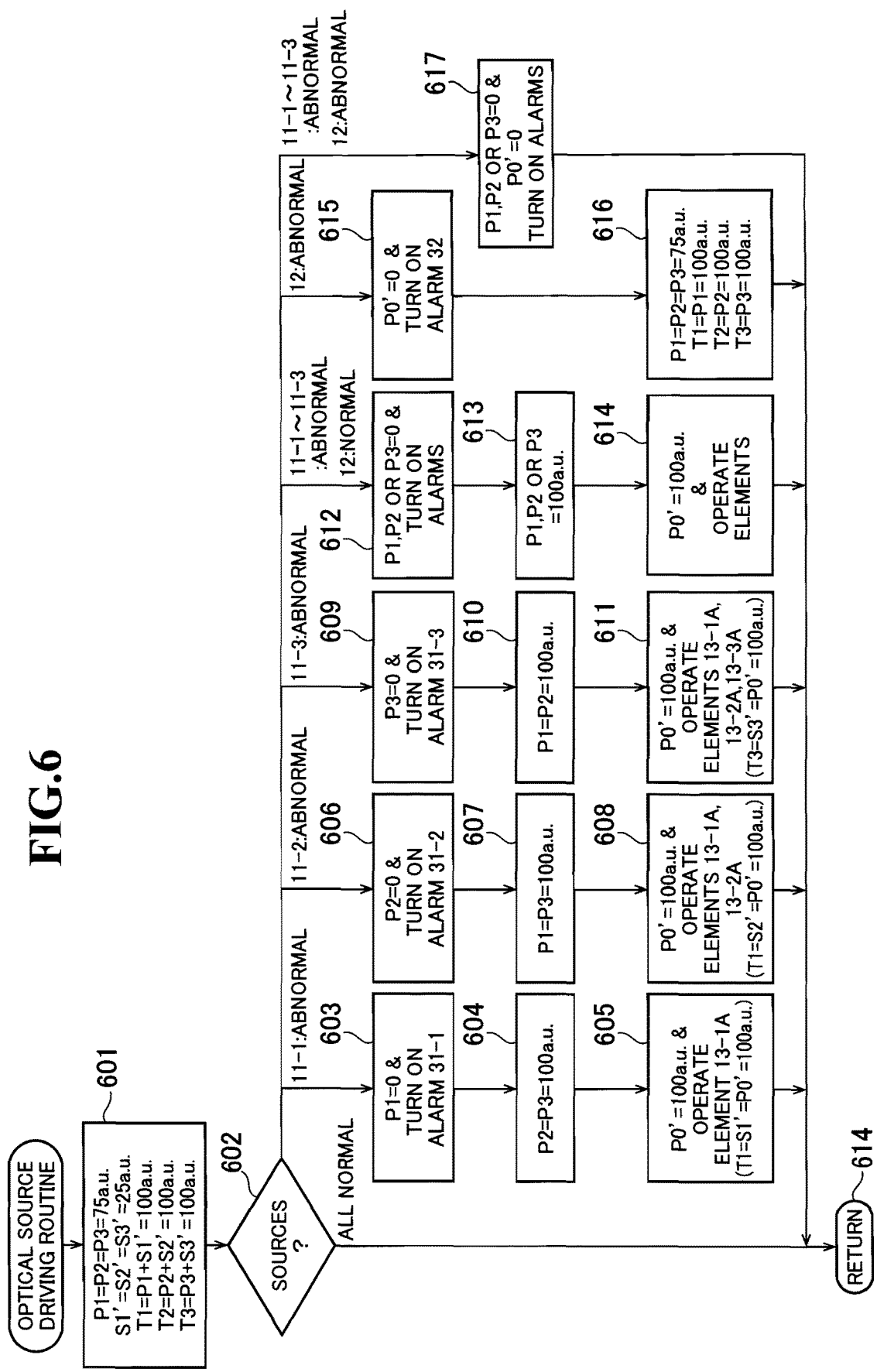
FIG. 6 is a flowchart for explaining a second operation of the control unit of FIG. 4.

A second operation of the control unit 3 of FIG. 4 will be explained with reference to FIG. 6. The optical source driving routine of FIG. 6 is started in accordance with the driving state parameters PR. Here, note that the light fluxes of the light beams P1, S1, . . . are also represented by P1, S1, . . . . Further, an expected light flux (predetermined light flux) T1, T2 or T3 is 100 a.u.

First, at step 601, the main optical sources 11-1, 11-2 and 11-3 are driven to emit 75 percent of the predetermined light flux of 100 a.u. That is, $P1=75$ a.u.

$P2=75$ a.u.

$P3=75$ a.u.

Simultaneously, the variable polarization elements 13-1A, 13-2A and 13-3A are controlled by the control unit 3, so that the S-polarized components S1', S2' and S3' of the polarization beams L1', L2' and L3' have 25 percent of the predetermined light flux:

$S1'=25$ a.u.

$S2'=25$ a.u.

$S3'=25$ a.u.

As a result, the output light beams T1, T2 and T3 of the light beam combining and splitting section 13-1, 13-2 and 13-3 are expected to have the predetermined light flux:

$T1=P1+S1'=100$ a.u.

$T2=P2+S2'=100$ a.u.

$T3=P3+S3'=100$ a.u.

Next, at step 602, it is determined whether the main optical sources 11-1, 11-2 and 11-3 and the sub optical source 12 are normal or abnormal in accordance with the sense signals $V_{P1}$, $V_{P2}$ and $V_{P3}$ of the main detectors 11-1a, 11-2a and 11-3a and the sense signal $V_{P0}'$ of the sub detector 12a. As a result, when the sense signals $V_{P1}$, $V_{P2}$ and $V_{P3}$ of the main detectors 11-1a, 11-2a and 11-3a of the main detectors 11-1a, 11-2a and 11-3a and the sense signal $V_{P0}'$ of the sub detector 12a are larger than the predetermined value, so that the main optical sources 11-1, 11-2 and 11-3 and the sub optical source 12 are determined to be all normal, the control proceeds directly to step 618. Only when the main optical source 11-1 is determined to be abnormal, does the control proceed via steps 603, 604 and 605 to step 618. Only when the main optical source 11-2 is determined to be abnormal, does the control proceed via steps 606, 607 and 608 to step 618. Only when the main optical source 11-3 is determined to be abnormal, does the control proceed via steps 609, 610 and 611 to step 618. When two or three of the main optical sources 11-1, 11-2 and 11-3 are determined to be abnormal, the control proceeds via steps 612, 613 and 614 to step 618. Only when the sub optical source 12 is determined to be abnormal, does the control proceed via steps 615 and 616 to step 618. When two or three of the main optical sources 11-1, 11-2 and 11-3 and the sub optical source 12 are determined to be abnormal, the control proceeds via step 617 to step 618.

Steps 603, 604 and 605 will now be explained. At step 603, the control unit 3 turns off the main optical source 11-1, i.e., P1=0, and turns on the alarm 31-1 which is informed to the driver. Next, at step 604, the light fluxes P2 and P3 of the normal main optical sources 11-2 and 11-3 are increased to the predetermined light flux:

$P2=100$ a.u.

$P3=100$ a.u.

Next, at step 604, the sub optical source 12 is driven to emit the predetermined light flux of 100 a.u. That is, $$P0'=100 \text{ a.u.}$$

Further, at the light beam combining and splitting section 13-1, the variable polarization element 13-1A is operated by the control unit 3 to convert the P-polarized light beam P0' of the sub optical source 12 into an S-polarized light beam S1'. That is, $$L1'=S1'$$

As a result, the output light beam T1 of the polarization beam splitter 13-1B is expected to have the predetermined light flux:

$$T1=S1'=P0'=100 \text{ a.u.}$$

Therefore, P1'=P2'=P3'=0

Thus, the sub optical source 12 serves as the main optical source 11-1. Then, the control proceeds to step 618.

Steps 606, 607 and 608 will now be explained. At step 606, the control unit 3 turns off the main optical source 11-2, i.e., P2=0, and turns on the alarm 31-2 which is informed to the driver. Next, at step 607, the light fluxes P1 and P3 of the normal main optical sources 11-1 and 11-3 are increased to the predetermined light flux:

$$P1=100 \text{ a.u.}$$

$$P3=100 \text{ a.u.}$$

Next, at step 608, the sub optical source 12 is driven to emit the predetermined light flux of 100 a.u. That is, $$P0'=100 \text{ a.u.}$$

Further, at the light beam combining and splitting section 13-1, the variable polarization element 13-1A is operated by the control unit 3 to transmit the P-polarized light beam P0' of the sub optical source 12 therethrough. That is, $$L1'=P0'$$

As a result, the light flux P1' of the polarization beam splitter 13-1B is expected to satisfy:

$$P1'=P0'$$

Further, at the light beam combining and splitting section 13-2, the variable polarization element 13-2A is operated by the control unit 3 to convert the P-polarized light beam P1' into an S-polarized light beam S2'. That is, $$L2'=S2'$$

As a result, the output light beam T2 of the polarization beam splitter 13-2B is expected to have the predetermined light flux:

$$T2=S2'=P0'=100 \text{ a.u.}$$

Therefore, P2'=P3'=0

Thus, the sub optical source 12 serves as the main optical source 11-2. Then, the control proceeds to step 618.

Steps 609, 610 and 611 will now be explained. At step 609, the control unit 3 turns off the main optical source 11-3, i.e., P3=0, and turns on the alarm 31-3 which is informed to the driver. Next, at step 610, the light fluxes P1 and P2 of the normal main optical sources 11-1 and 11-2 are increased to the predetermined light flux:

$$P1=100 \text{ a.u.}$$

$$P2=100 \text{ a.u.}$$

Next, at step 611, the sub optical source 12 is driven to emit the predetermined light flux of 100 a.u. That is, $$P0'=100 \text{ a.u.}$$

Further, at the light beam combining and splitting section 13-1, the variable polarization element 13-1A is operated by the control unit 3 to transmit the P-polarized light beam P0' of the sub optical source 12 therethrough. That is, $$L1'=P0'$$

As a result, the light flux P1' of the polarization beam splitter 13-1B is expected to satisfy:

$$P1'=P0'$$

Further, at the light beam combining and splitting section 13-2, the variable polarization element 13-2A is operated by the control unit 3 to transmit the P-polarized light beam P1' of the light beam combining and splitting section 13-2 therethrough. That is, $$L2'=P1'$$

As a result, the light flux P2' of the polarization beam splitter 13-2B is expected to satisfy:

$$P2'=P0'$$

Further, at the light beam combining and splitting section 13-3, the variable polarization element 13-3A is operated by the control unit 3 to convert the P-polarized light beam P2' into an S-polarized light beam S3'. That is, $$L3'=S3'$$

As a result, the output light beam T3 of the polarization beam splitter 13-3B is expected to have the predetermined light flux:

$$T3=S3'=P0'=100 \text{ a.u.}$$

Therefore, P3'=0

Thus, the sub optical source 12 serves as the main optical source 11-3. Then, the control proceeds to steps 618.

Steps 612, 613 and 614 will now be explained. At step 612, since two or three of the main optical sources 11-1, 11-2 and 11-3 are determined to be abnormal, the two or three of the main optical sources 11-1, 11-2 and 11-3 are turned off, and their corresponding alarms 31-1, 31-2 and 31-3 are turned on. Next, at step 613, the light flux of the normal main optical source is increased to the predetermined light flux. Next, at step 614, the sub optical source 12 is driven to emit a light flux which is the same as a total light flux of the light fluxes of the abnormal main optical sources such as 200 a.u. or 300 a.u. That is, the variable polarization elements 13-1A, 13-2A and 13-3A are controlled by the control unit 3 to emit S-polarized light beams S1', S2' and S3', so that the output light beams T1, T2 and T3 of the polarization beam splitters 13-1B, 13-2B and 13-3B are expected to emit the predetermined light flux:

$$T1=T2=T3=100 \text{ a.u.}$$

In the above-mentioned case, when all the main optical sources 11-1, 11-2 and 11-3 are determined to be abnormal, the sub optical source 12 is driven at a light flux of 300 a.u. which would invite a COD phenomenon. In order to suppress generation of such a COD phenomenon in the sub optical source 12, the sub optical source 12 can be driven at a light flux of 100 a.u. while each of the output light beams T1, T2 and T3 of the polarization beam splitters 13-1B, 13-2B and 13-3B is expected to have a one-third of the predetermined light flux:

$$T1=T2=T3=100/3 \text{ a.u.}$$

Or, the sub optical source 12 can be driven at a light flux of 150 a.u. while each of the output light beams T1, T2 and T3 of the polarization beam splitters 13-1B, 13-2B and 13-3B is expected to have a half of the predetermined light flux:

$$T1=T2=T3=100/2=50 \text{ a.u.}$$

Then, the control proceeds to step 618.

Steps 615 and 616 will now be explained. At step 615, the control unit 3 turns off the sub optical source 12, i.e., P0'=0, and turns on the alarm 32 which is informed to the driver. Next, at step 616, each of the light fluxes of the normal main optical sources 11-1, 11-2 and 11-3 is increased to the predetermined light flux:

$$P1=100 \text{ a.u.}$$

$$P2=100 \text{ a.u.}$$

$$P3=100 \text{ a.u.}$$

As a result, the output light beams T1, T2 and T3 of the polarization beam splitters 13-1B, 13-2B and 13-3B are expected to have the predetermined light flux:

$$T1=P1=100 \text{ a.u.}$$

$$T2=P2=100 \text{ a.u.}$$

$$T3=P3=100 \text{ a.u.}$$

Then, the control proceeds to step 618.

At step 617, since two or three of the main optical sources 11-1, 11-2 and 11-3 and the sub optical source 12 are determined to be abnormal, the two or three of the main optical sources 11-1, 11-2 and 11-3 and the sub optical source 12 are turned off, and their corresponding alarms 31-1, 31-2 and 31-3 are turned on, which is informed to the driver. For example, $$P1, P2 \text{ or } P3=0$$

$$P0'=0$$

Then, the control proceeds to step 618.

Thus, according to the second operation of the control unit 3 as illustrated in FIG. 6, when the main optical sources 11-1, 11-2 and 11-3 and the sub optical source 12 are determined to be all normal, each of the main optical sources 11-1, 11-2 and 11-3 and the sub optical source 12 are driven. That is, the sub optical source 12 is driven to decrease the light fluxes of the main optical sources 11-1, 11-2 and 11-3, thus suppressing the generation of the COD phenomenon therein. Also, when one or more of the main optical sources 11-1, 11-2 and 11-3 are determined to be abnormal, the light flux of the normal sub optical source is increased, so that the normal sub optical source can serve as the abnormal main optical sources, and the abnormal states are informed by the alarms to the driver. Further, when only the sub optical source 12 is determined to be abnormal, the light fluxes of the normal main optical sources 11-1, 11-2 and 11-3 are increased, and the abnormal state of the sub optical source 12 is informed by the alarm 32 to the driver. Note that, the predetermined light fluxes T1, T2 and T3 can be different from each other.

Figure 7:
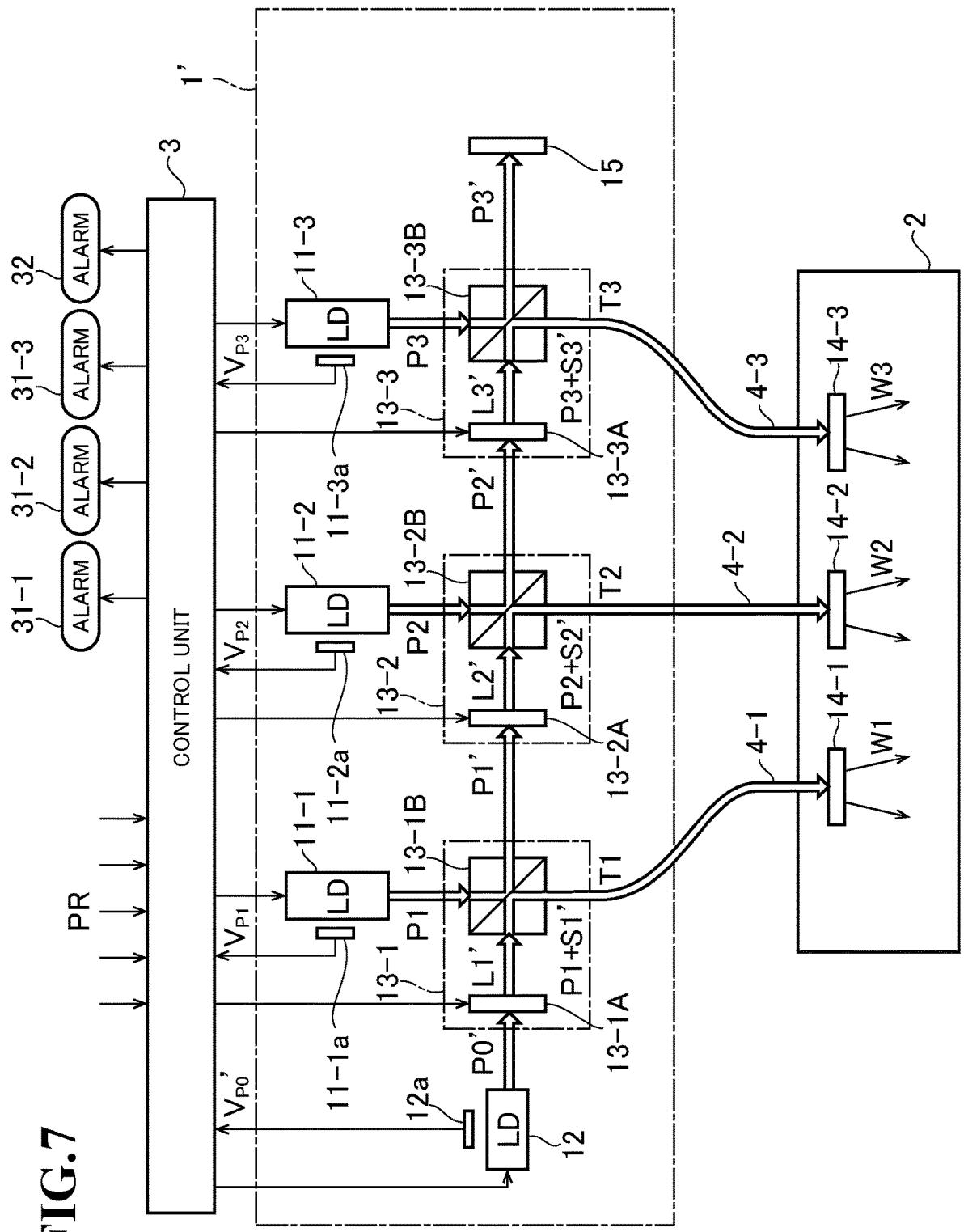
FIG. 7 is a block diagram illustrating a modification of the vehicle lighting apparatus of FIG. 4.

In FIG. 7, which illustrates a modification of the vehicle lighting apparatus of FIG. 4, the wavelength converting members 14-1, 14-2 and 14-3 are moved from the one-dimensional optical source unit 1' to the projection optical unit 2. In this case, connections between the light beam combining and splitting sections 13-1, 13-2 and 13-3 of the one-dimensional optical source unit 1' and the wavelength converting members 14-1, 14-2 and 14-3 of the projection optical unit 2 are carried out by optical conductive members 4-1, 4-2 and 4-3 such as optical fibers. Thus, the projection optical unit 2 can be remote from the one-dimensional optical source unit 1', so that the vehicle lighting apparatus can be reduced in size.

Figure 8:
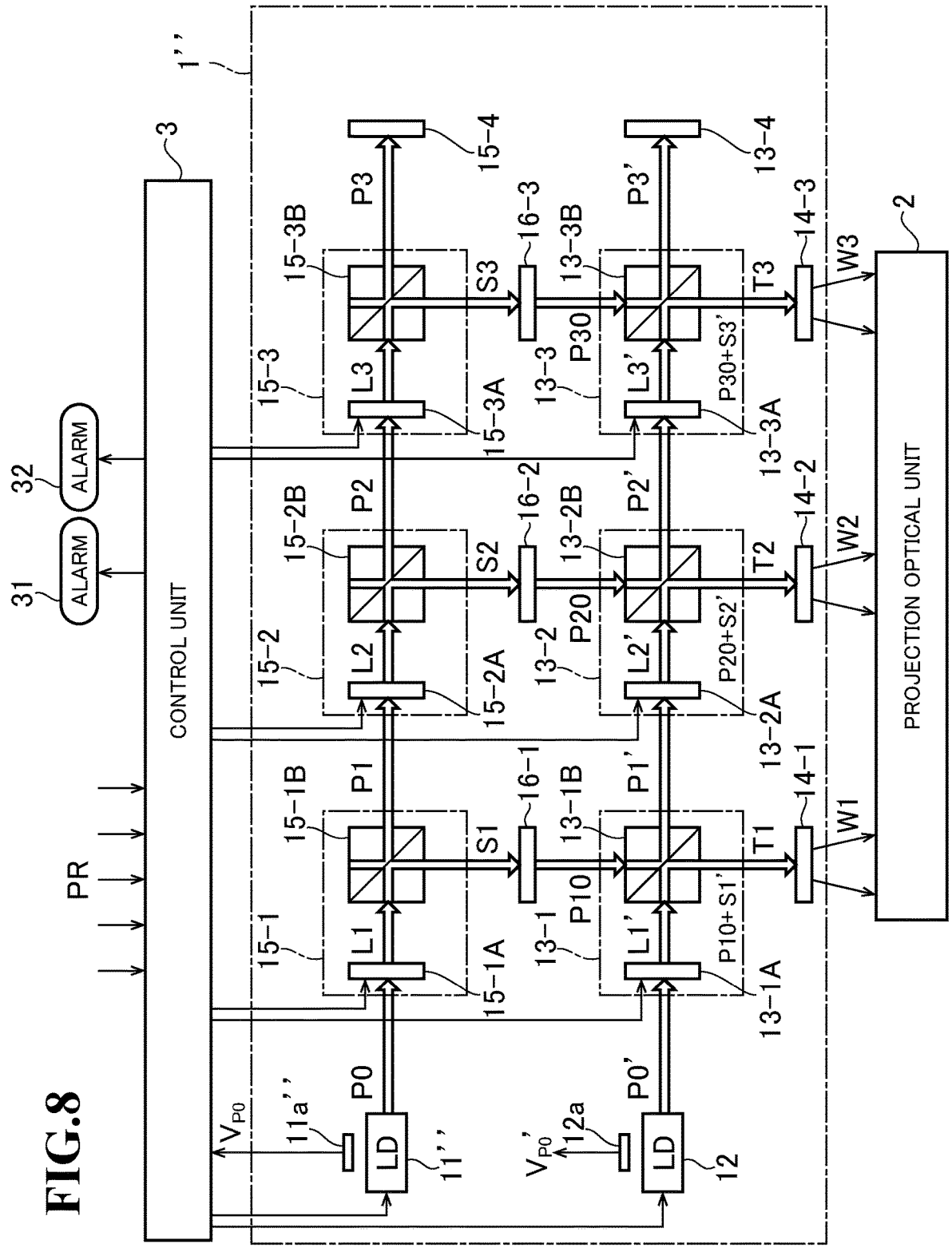
FIG. 8 is a block diagram illustrating a vehicle lighting apparatus including a third embodiment of the optical source unit according to the presently disclosed subject matter.

In FIG. 8, which illustrates a vehicle lighting apparatus including a third embodiment of the optical source unit according to the presently disclosed subject matter, the one-dimensional optical source unit 1' of FIG. 4 is replaced by a one-dimensional optical source unit 1"

In the one-dimensional optical source unit 1", a single main optical source 11" is provided instead of the main optical sources 11-1, 11-2 and 11-3 of FIG. 4. In this case, the main optical source 11" is associated with a main detector 11" a similar to the main detector 11a of FIG. 1. Also, the main optical source 11" emits a P-polarized light beam P0.

In the one-dimensional optical unit 1", three light beam splitting sections 15-1, 15-2 and 15-3 and a light shield member 15-4 are provided. The light beam splitting sections 15-1, 15-2 and 15-3 and the light shield member 15-4 are serially located at the output light path of the main optical source 11" Each of the light beam splitting sections 15-1, 15-2 and 15-3 is constructed by a variable polarization element 15-1A, 15-2A or 15-3A and a polarization beam splitter 15-1B, 15-2B or 15-3B. The variable polarization element 15-1A is controlled by the control unit 3 to change the polarization state of the P-polarized light beam P0 of the main optical source 11" by an amount indicated by the control unit 3 to emit a polarization light beam L1. The variable polarization element 15-2A is controlled by the control unit 3 to change the polarization state of the P-polarized light beam P1 of the light beam splitting element 15-1 by an amount indicated by the control unit 3 to emit a polarization beam L2. The variable polarization element 15-3A is controlled by the control unit 3 to change the polarization state of the P-polarized light beam P2 of the light beam combining and splitting element 15-2 by an amount indicated by the control unit 3 to emit a polarization beam L3.

The polarization beam splitter 15-1B (15-2B, 15-3B) splits the polarization light beam L1(L2, L3) emitted from the variable polarization element 15-1A(15-2A, 15-3A) into a P-polarized component P1(P2, P3) and an S-polarized component S1(S2, S3). That is, $$L1=P1+S1$$

$$L2=P2+S2$$

$$L3=P3+S3$$

In this case, the light flux ratio of the P-polarized light beam P1(P2, P3) to the S-polarized light beam S1(S2, S3) at the polarization beam splitting element 15-1B(15-2B, 15-3B) is determined by the polarization state of the light beam L1(L2, L3) emitted from the variable polarization element 15-1A (15-2A, 15-3A).

The polarization beam splitter 15-B(15-2B, 15-3B) transmits the P-polarized component P1(P2, P3) to the next stage light beam splitting section or the light shield member 15-4. Note that the P-polarized light beam P3 is absorbed by the light shield element 15-4, and therefore, is not emitted from the optical source unit 1". Simultaneously, the polarization beam splitter 15-1B(15-2B, 15-3B) reflects the S-polarized component S1(S2, S3) of the polarization light beam L1(L2, L3) emitted from the variable polarization element 15-1A (15-2A, 15-3A) to a fixed polarization element 16-1(16-2, 16-3).

The variable polarization elements 15-1A, 15-2A and 15-3A have the same structures as the variable polarization elements 13-1A, 13-2B and 13-3B. Also, the fixed polarization elements 16-1, 16-2 and 16-3 have the same structures as the variable polarization elements 13-1A, 13-2A and 13-3A; however, the changed polarization direction thereby is fixed, i.e., 90°. That is, the fixed polarization elements 16-1, 16-2 and 16-3 change the polarization directions of the S-polarized components S1, S2 and S3 to convert them into P-polarized components P10, P20 and P30, respectively.

The P-polarized components P10, P20 and P30 from the fixed polarization beam splitters 16-1, 16-2 and 16-3 are supplied to the light beam combining and splitting sections 13-1B, 13-2B and 13-3B, respectively, on the side of the sub optical source 12.

Thus, an arbitrary ratio of the light fluxes of the P-polarized light beams P10, P20 and P30 incident to the polarization beam splitters 13-1B, 13-2B and 13-3B can be adjusted in accordance with the polarization states of the output light beams L1, L2 and L3 of the variable polarization elements 15-1A, 15-2A and 15-3A controlled by the control unit 3. In this case, $$PO=P10+P20+P30+P3$$

Figure 9:
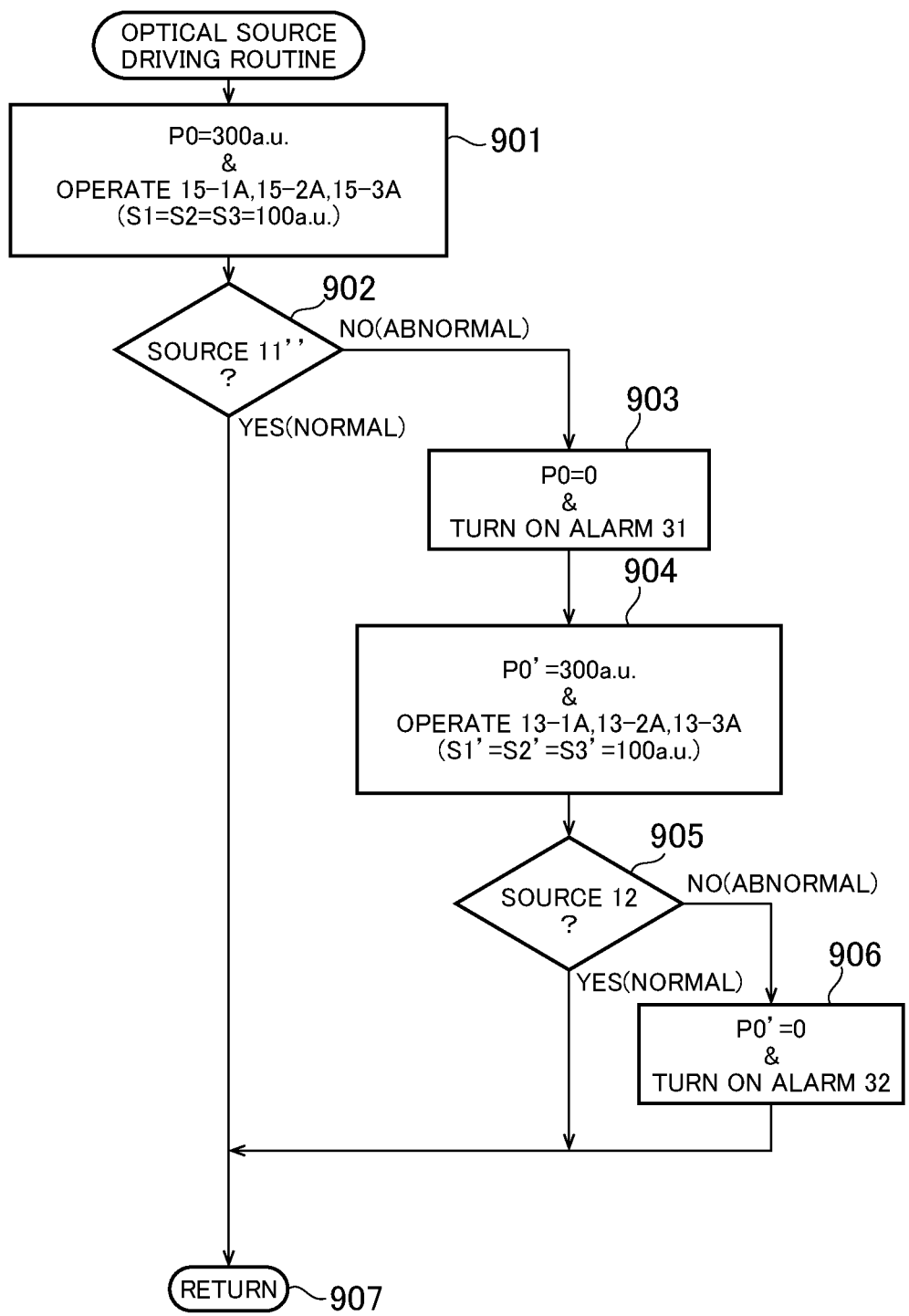
FIG. 9 is a flowchart for explaining a first operation of the control unit of FIG. 8.

A first operation of the control unit 3 of FIG. 8 will be explained with reference to FIG. 9. The optical source driving routine of FIG. 9 is started in accordance with the driving state parameters PR. Here, note that the light fluxes of the light beams P1, S1, . . . are also represented by P1, S1, . . . . Further, an expected light flux (predetermined light flux) T1, T2 or T3 is 100 a.u.

First, at step 901, the main optical source 11" is driven to emit a light flux of 300 a.u. or more. For example, $$P0=300 \text{ a.u.}$$

In this case, the S-polarized components S1, S2 and S3 of the output light beams L1, L2 and L3 of the variable polarization elements 15-1A, 15-2A and 15-3A satisfy:

$$P0=S1+S2+S3+P3$$

where the ratio of S1, S2 and S3 is variable.

In this case, the variable polarization elements 15-1A, 15-2A and 15-3A are controlled by the control unit 3 to satisfy:

$$S1=S2=S3=100 \text{ a.u.}$$

The S-polarized components S1, S2 and S3 are converted by the fixed polarization elements 16-1, 16-2 and 16-3 to the P-polarized components P10, P20 and P30, respectively. That is, $$P10=P20=P30=100 \text{ a.u.}$$

As a result, the output light beams T1, T2 and T3 of the light beam combining and splitting section 13-1, 13-2 and 13-3 are expected to have the predetermined light flux:

$$T1=P10=100 \text{ a.u.}$$

$$T2=P20=100 \text{ a.u.}$$

$$T3=P30=100 \text{ a.u.}$$

Next, at step 902, it is determined whether the main optical source 11" is normal or abnormal in accordance with the sense signal $V_{P0}$ of the main detector 11"a. As a result, when the sense signal $V_{P0}$ of the main detector 11"a is larger than the predetermined value, so that the main optical source 11" is determined to be normal, the control proceeds directly to step 907. On the other hand, when the main optical source 11" is determined to be abnormal, the control proceeds via steps 903 through 906 to step 907.

Steps 903 and 904 will now be explained. At step 903, the control unit 3 turns off the main optical source 11", i.e., P0=0, and turns on the alarm 31 which is informed to the driver. Next, at step 904, the sub optical source 12 is driven to emit a light flux of 300 a.u. or more. For example, $$P0'=300 \text{ a.u.}$$

In this case, the S-polarized components S1', S2' and S3' of the output light beams L1', L2' and L3' of the variable polarization elements 13-1A, 13-2A and 13-3A satisfy:

$$P0'=S1'+S2'+S3'+P3'$$

where the ratio of S1', S2' and S3' is variable. Also, the variable polarization elements 13-1A, 13-2A and 13-3A are controlled by the control unit 3 to satisfy:

$$S1'=S2'=S3'=100 \text{ a.u.}$$

As a result, the output light beams T1, T2 and T3 of the polarization beam splitters 13-1B, 13-2B and 13-3B are expected to have the predetermined light flux:

$$T1=S1'=100 \text{ a.u.}$$

$$T2=S2'=100 \text{ a.u.}$$

$$T3=S3'=100 \text{ a.u.}$$

In the above-mentioned case, note that the sub optical source 12 is driven at a light flux of 300 a.u. which would invite a COD phenomenon. In order to suppress generation of such a COD phenomenon in the sub optical source 12, the sub optical source 12 can be driven at a light flux of 100 a.u. while each of the output light beams T1, T2 and T3 of the polarization beam splitters 13-1B, 13-2B and 13-3B is expected to have one-third of the predetermined light flux:

$$T1=T2=T3=100/3 \text{ a.u.}$$

Or, the sub optical source 12 can be driven at a light flux of 150 a.u. while each of the output light beams T1, T2 and T3 of the polarization beam splitters 13-1B, 13-2B and 13-3B is expected to have half of the predetermined light flux:

$$T1=T2=T3=100/2=50 \text{ a.u.}$$

Next, at step 905, it is determined whether the sub optical source 12 is normal or abnormal in accordance with the sense signal $V_{P0}'$ of the sub detector 12a. As a result, when the sense signal $V_{P0}'$ of the sub detector 12a is larger than the predetermined value, so that the sub optical source 12 is determined to be normal, the control proceeds directly to step 907. Otherwise, the control proceeds to step 906. At step 906, the control unit 3 turns off the sub optical source 12, i.e., P0'=0, and turns on the alarm 32 which is informed to the driver. Then, the control proceeds to step 907.

Thus, according to the first operation of the control unit 3 as illustrated in FIG. 9, when the main optical source 11" is determined to be normal, the output light beams T1, T2 and T3 are realized by the output light beams S1, S2 and S3 of the light beam splitting sections 15-1, 15-2 and 15-3. On the other hand, when the sub optical source 12 is determined to be normal while the main optical source 11" is determined to be abnormal, the output light beams T1, T2 and T3 are realized by the output light beams S1', S2' and S3' of the variable polarization elements 13-1A, 13-2A and 13-3A. At any case, each of the output light fluxes T1, T2 and T3 has the predetermined light flux of 100 a.u. The abnormal state of the optical source is informed by the alarm 31 or 32 to the driver. Also, when both of the optical sources 11 and 12 are determined to be abnormal, the abnormal states are informed by the alarms 31 and 32 to the driver. Note that, the predetermined light fluxes T1, T2 and T3 can be different from each other.

Figure 10:
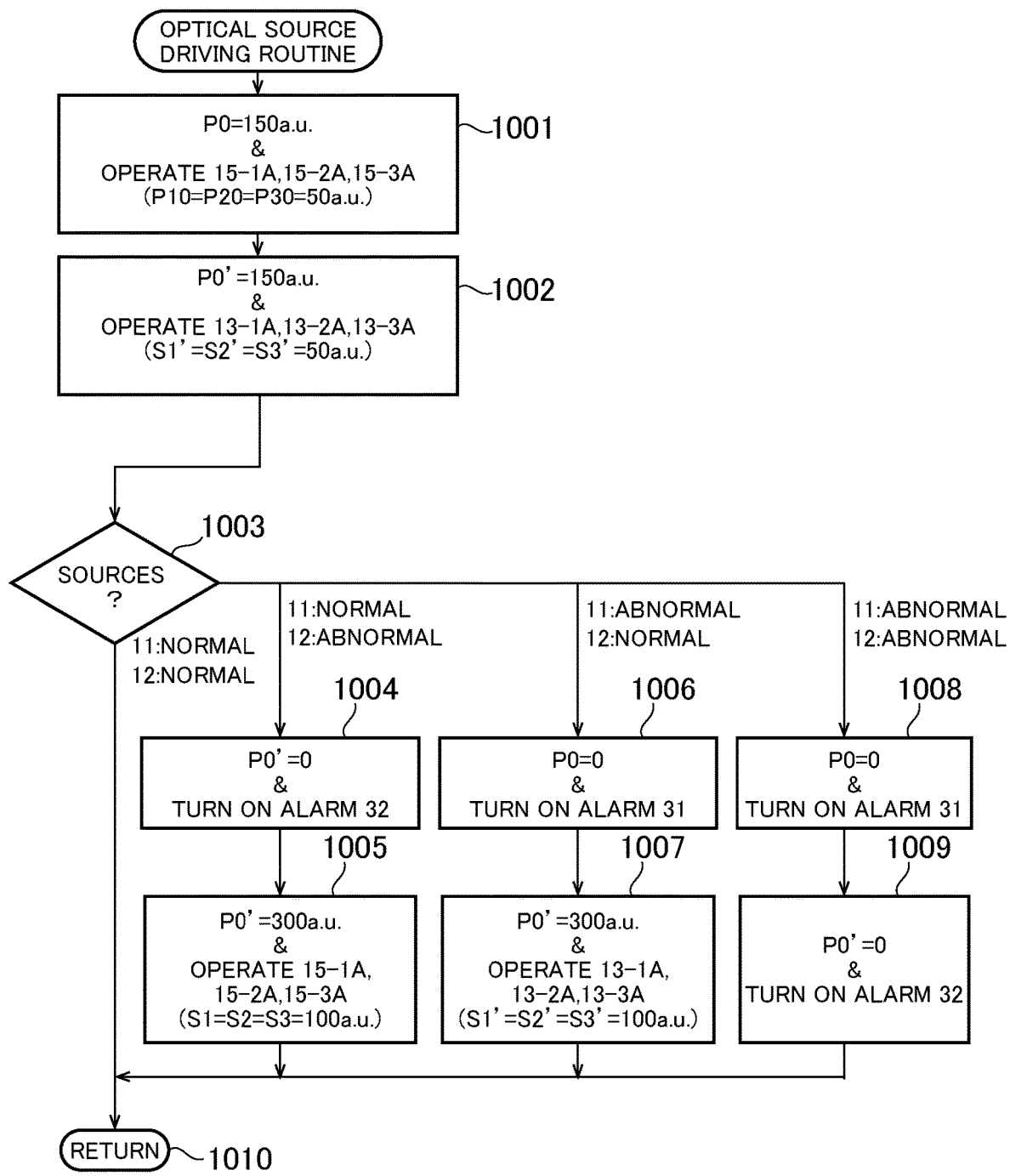
FIG. 10 is a flowchart for explaining a second operation of the control unit of FIG. 8.

A second operation of the control unit 3 of FIG. 8 will be explained with reference to FIG. 10. The optical source driving routine of FIG. 10 is started in accordance with the driving state parameters PR. Here, note that the light fluxes of the light beams P1, S1, . . . are also represented by P1, S1, . . . . Further, an expected light flux (predetermined light flux) T1, T2 or T3 is 100 a.u.

First, at step 1001, the main optical source 11" is driven to emit a light flux of 150 a.u. or more. For example, $P0=150$ a.u.

In this case, the S-polarized components S1, S2 and S3 of the output light beams L1, L2 and L3 of the variable polarization elements 15-1A, 15-2A and 15-3A satisfy:

$P0=S1+S2+S3+P3$ where the ratio of S1, S2 and S3 is variable.

Also, the variable polarization elements 15-1A, 15-2A and 15-3A are controlled by the control unit 3 to satisfy:

$S1=S2=S3=50$ a.u.

The S-polarized components S1, S2 and S3 are converted by the fixed polarization elements 16-1, 16-2 and 16-3 to the P-polarized components P10, P20 and P30, respectively. That is, $P10=P20=P30=50$ a.u.

Next, at step 1002, the sub optical source 12 is driven to emit a light flux of 150 a.u. or more. For example, $P0'=150$ a.u.

In this case, the S-polarized components S1', S2' and S3' of the output light beams L1', L2' and L3' of the variable polarization elements 13-1A, 13-2A and 13-3A satisfy:

$P0'=S1'+S2'+S3'+P3'$ where the ratio of S1', S2' and S3' is variable. Also, the variable polarization elements 13-1A, 13-2A and 13-3A are controlled by the control unit 3 to satisfy:

$S1'=S2'=S3'=50$ a.u.

As a result, the output light beams T1, T2 and T3 of the light beam combining and splitting section 13-1, 13-2 and 13-3 are expected to have the predetermined light flux:

$T1=P10+S1'=100$ a.u.

$T2=P20+S2'=100$ a.u.

$T3=P30+S3'=100$ a.u.

Next, at step 1003, it is determined whether the main optical source 11" and the sub optical source 12 are normal or abnormal in accordance with the sense signal $V_{P0}$ of the main detector 11"a and the sense signal $V_{P0}'$ of the sub detector 12a. As a result, when the sense signal $V_{P0}$ of the main detector 11"a and the sense signal $V_{P0}'$ of the sub detector 12 are both larger than the predetermined value, so that the main optical source 11" and the sub detector 12a are determined to be normal, the control proceeds directly to step 1010. Also, when the main optical source 11" and the sub optical source 12 are determined to be normal and abnormal, respectively, the control proceeds via steps 1004 and 1005 to step 1010. Further, when the main optical source 11 and the sub optical source 12 are determined to be abnormal and normal, respectively, the control proceeds via steps 1006 and 1007 to step 1010. Furthermore, when the main optical source 11" and the sub optical source 12 are determined to be both abnormal, the control proceeds via steps 1008 and 1009 to step 1010.

Steps 1004 and 1005 will now be explained. At step 1004, the abnormal sub optical source 12 is turned off, i.e., P0'=0, and the alarm 32 is turned on, which is informed to the driver. Next, at step 1005, the light flux of the normal main optical source 11" is increased to thrice the predetermined light flux such as 300 a.u. That is, $P0=300$ a.u.

Further, the variable polarization elements 15-1A, 15-2A and 15-3A are controlled by the control unit 3 to satisfy:

$S1=S2=S3=100$ a.u.

The S-polarized components S1, S2 and S3 are converted by the fixed polarization elements 16-1, 16-2 and 16-3 into:

$P10=P20=P30=100$ a.u.

Therefore, the output light beams T1, T2 and T3 of the light beam combining and splitting section 13 is expected to be the predetermined light flux:

$T1=P10=100$ a.u.

$T2=P20=100$ a.u.

$T3=P30=100$ a.u.

Then, the control proceeds to step 1010.

Steps 1006 and 1007 will now be explained. At step 1006, the abnormal main optical source 11" is turned off, i.e., P0=0, and the alarm 31 is turned on, which is informed to the driver. Next, at step 1007, the light flux of the normal sub optical source 12 is increased to thrice the predetermined light flux such as 300 a.u. That is, $P0'=300$ a.u.

Further, the variable polarization elements 13-1A, 13-2A and 13-3A are controlled by the control unit 3 to satisfy:

$S1'=S2'=S3'=100$ a.u.

Therefore, the output light beams T1, T2 and T3 of the light beam combining and splitting section 13 is expected to be the predetermined light flux:

$T1=S1'=100$ a.u.

$T2=S2'=100$ a.u.

$T3=S3'=100$ a.u.

Then, the control proceeds to step 1010.

Steps 1008 and 1009 will now be explained. At step 1008, the control unit 3 turns off the main optical source 11", i.e., P0=0, and turns on the alarm 31 which is informed to the driver. Next, at step 1009, the control unit 3 turns off the sub optical source 12, i.e., P0'=0, and turns on the alarm 32 which is informed to the driver. Then, the control proceeds to step 1010.

Thus, according to the second operation of the control unit 3 as illustrated in FIG. 10, when the main optical source 11" and the sub optical source 12 are determined to be both normal, the output light beams T1, T2 and T3 are realized at the light beam combining and splitting section 13-1, 13-2 and 13-3 by combining the output light beam P0 of the main optical source 11" with the output light beam P0' of the sub optical source 12. On the other hand, when one of the main optical source 11" and the sub optical source 12 is determined to be normal while the other is determined to be abnormal, the output light beams T1, T2 and T3 are realized by the output light beams S1', S2' and S3' of the variable polarization elements 13-1A, 13-2A and 13-3A by driving only the one normal optical source. At any case, each of the output light fluxes T1, T2 and T3 has the predetermined light flux of 100 a.u. In this case, since the optical path length between the main optical source 11" and the light beam combining section 13 is almost the same as optical path length between the sub optical source 12 and the light beams combining section 13, the light energy density distribution is unchanged even when the main optical source 11" and the sub optical source 12 are switched, to suppress the destruction of the light distribution. The abnormal state of the optical source is informed by the alarm 31 or 32 to the driver. Also, when both of the optical sources 11 and 12 are determined to be abnormal, the abnormal states are informed by the alarms 31 and 32 to the driver. Note that, the predetermined light fluxes T1, T2 and T3 can be different from each other.

In FIG. 8, the light path between the optical paths from the main optical source 11" to the light beam combining and splitting section 13-1, 13-2 and 13-3 is disadvantageous in loss of light energy due to the presence of the fixed polarization elements 16-1, 16-2 and 16-3 as compared with light paths between the optical paths from the sub optical source 12 to the light beam combining and splitting section 13-1, 13-2 and 13-3. Therefore, the main optical source 11" can serve as a sub optical source while the sub optical source 12 can serve as a main optical source.

Note that the modification of FIG. 7 can be applied to the vehicle lighting apparatus of FIG. 8.

Figure 11:
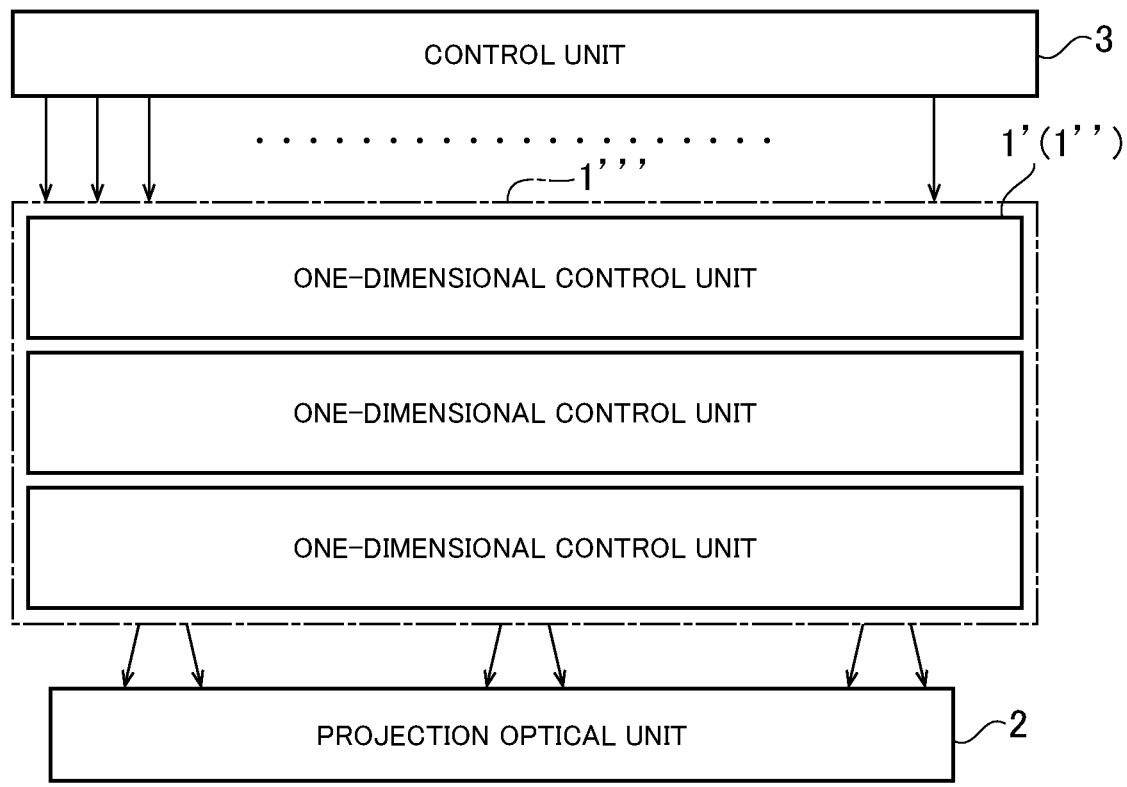
FIG. 11 is a block diagram illustrating another vehicle lighting apparatus including the one-dimensional optical source unit of FIG. 4 or 8.

FIG. 11, which illustrates another vehicle lighting apparatus according to the presently disclosed subject matter, a two-dimensional optical unit 1''' of three rows and three columns is constructed by three one-dimensional optical units each including the one-dimensional optical unit 1' of FIG. 4 or the one-dimensional optical unit 1" of FIG. 8. Note that the two-dimensional optical unit 1''' is not limited to a three-rows and three columns structure.

In the two-dimensional optical unit 1''' of FIG. 11, three optical sources 12 (or three optical sources 11" and three optical sources 12) are required. In order to reduce the number of optical sources; however, optical source units 1' (or 1") as illustrated in FIG. 12 can be provided.

Figure 12:
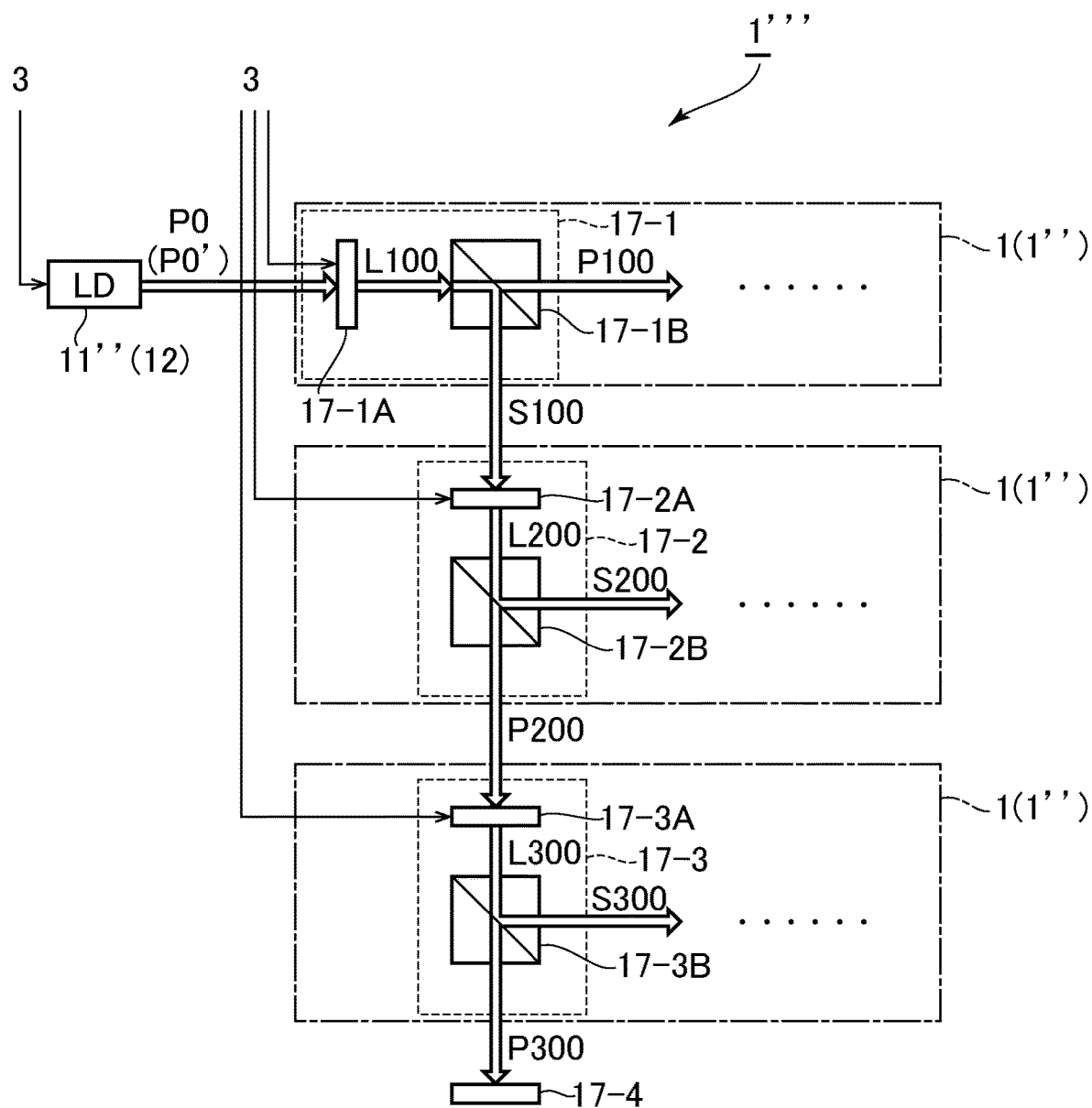
FIG. 12 is a block diagram illustrating a modification of the vehicle lighting apparatus of FIG. 11.

In FIG. 12, an optical unit 11" or 12 for emitting a light beams P0 or P0' is common to the one-dimensional optical units 1' (or 1"), and light beam splitting sections 17-1, 17-2 and 17-3 are provided in the one-dimensional optical units 1' (or 1"), and also a light shield member 17-4 is provided at the terminal of the light beam splitting section 17-3.

Each of the light beam splitting sections 17-1, 17-2 and 17-3 is constructed by a variable polarization element 17-1A, 17-2A or 17-3A and a polarization beam splitter 17-1B, 17-2B or 17-3B. The polarization light beams L100, L200 and L300 of the variable polarization elements 17-1A, 17-2A and 17-3A are controlled by the control unit 3. As a result, the P-polarized light beam P0 (or P0') is distributed as a P-polarized component P100 of the light beam splitter 17-1, an S-polarized component S200 of the light beam splitter 17-2 and an S-polarized component S300 of the light beam splitter 17-3. In this case, the total flux of the P-polarized component P100 and the S-polarized components S200 and S300 is equal to the flux of the P-polarized light flux P0 (or P0') of the optical source 11" (or 12). That is, $$P0 \text{ or } P0' = P100 + S200 + S300 + P300$$

In the optical unit 17-1, note that if a P-polarized component P100 is supplied by the variable polarization element 17-1A to the light beam splitting section 17-2, $$P0 = S100 + S200 + S300$$

That is, the position of the light beam splitting section 17-1 can be rotated by 90°. Also, the S-polarized components S200 and S300 correspond to the P-polarized components P0 (or P0'); in this case, the S-polarized components can be converted by the variable polarization elements 13-1A and 15-1A into the S-polarized components, so that the S-polarized components S200 and S300 invite no problem.

Figure 13:
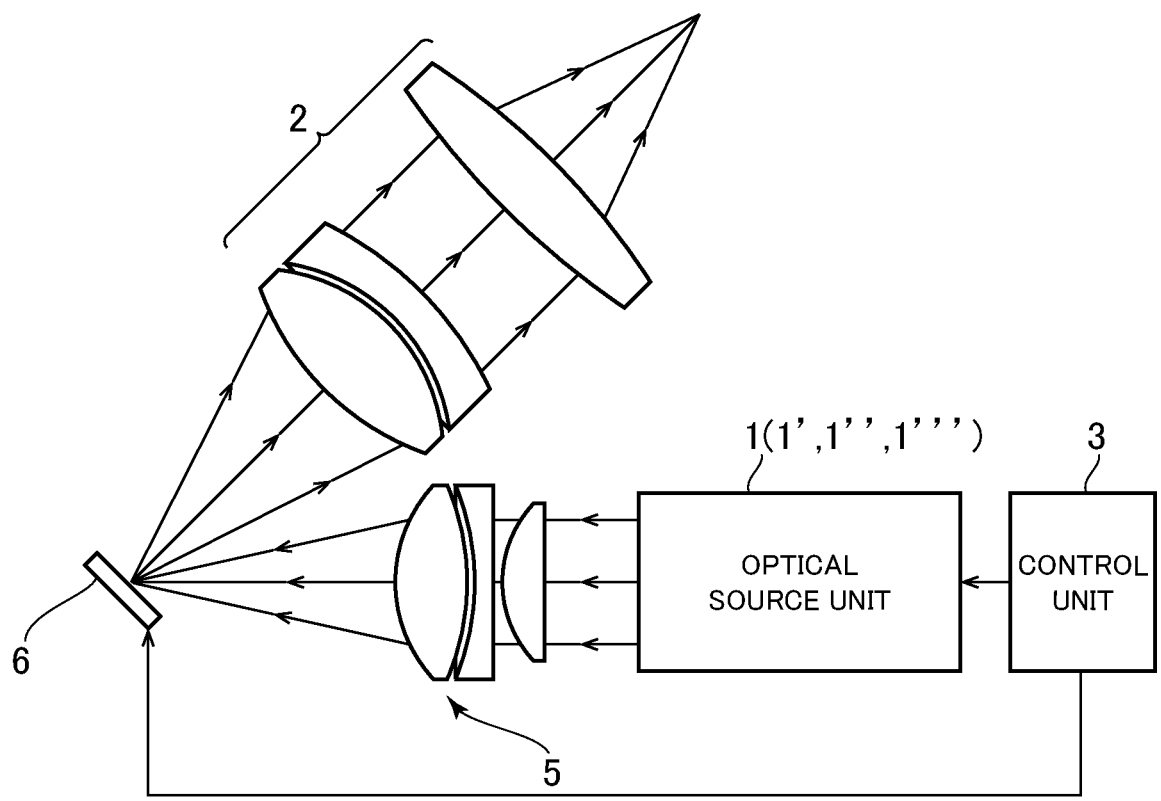
FIG. 13 is a block diagram illustrating a further vehicle lighting apparatus including the optical source unit of FIG. 1, 4 or 8.

In FIG. 13, which illustrates a further vehicle lighting apparatus according to the presently disclosed subject matter, a condenser lens 5 and a digital mirror device (DMD) 6 are inserted between the optical source unit 1 (the one-dimensional optical source unit 1' or 1" of FIG. 4 or 6, or the two-dimensional optical source unit 1''' of FIG. 8) and the projection optical unit 2. The digital mirror device 6 is constructed by multiple micromirrors manufactured by a micro electro mechanical system (MEMS) technology on a CMOS static random access memory (SRAM) substrate. A mirror surface (reflection surface) of each of the micromirrors is twisted on an ON state around a twisted axis by a sloped angle+θ with respect to the neutral state, and is twisted on an OFF state around the twisted axis by a sloped angle−θ with respect to the neutral state. In this case, the ON and OFF states of one micromirror corresponds to binary values of each SRAM cell, and θ is 10° or 12°, for example (see: JP2004-210131A, FIGS. 3 to 6). The digital mirror device 6 is controlled by the control unit 3.

In FIG. 13, the condenser lens 5 and the digital mirror device 6 are located on an optical axis of the optical source unit 1 (1', 1", 1'''), and also, the digital mirror device 6 is located at a focus of the condenser lens 5. On the other hand, the optical axis of the projection optical unit 2 is sloped at a predetermined angle with the optical axis of the optical source unit 1 (1', 1", 1''') and the condenser lens 5. Therefore, an output light beam from the optical source unit 1 (1', 1", 1''') is condensed by the condenser lens 5 near the digital mirror device 6, and is reflected by the digital mirror device 6 toward the projection optical unit 2.

Figure 14:
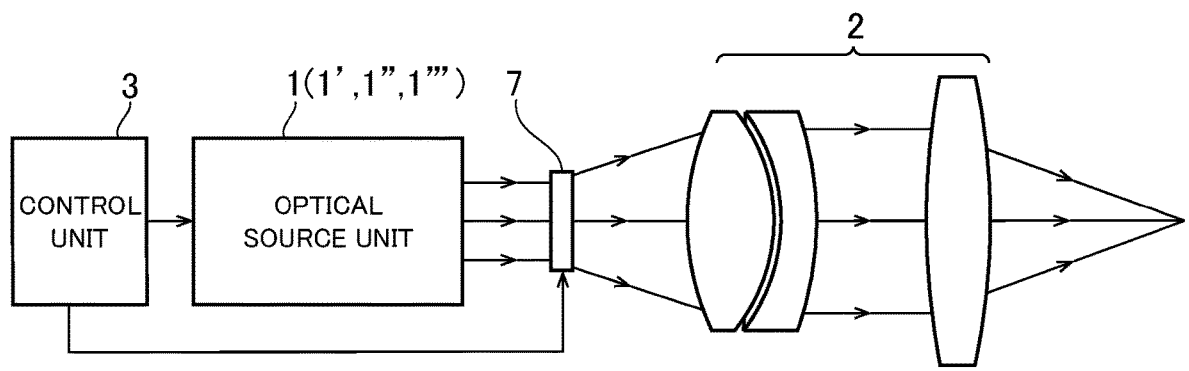
FIG. 14 is a block diagram illustrating a still other vehicle lighting apparatus including the optical source unit of FIG. 1, 4 or 8.

In FIG. 14, which illustrates a still vehicle lighting apparatus according to the presently disclosed subject matter, a liquid crystal shutter 7 inserted between the optical source unit 1 (the one-dimensional optical source unit 1' or 1" of FIG. 4 or 6, or the two-dimensional optical source unit 1''' of FIG. 8) and the projection optical unit 2. The liquid crystal shutter 7 is controlled by the control unit 3.

In FIG. 14, the liquid crystal shutter 7 is located on an optical axis of the optical source unit 1 (1', 1", 1'''), and also, the liquid crystal shutter 7 is located at a focus of the projection optical unit 2. Therefore, an output light beam from the optical source unit 1 (1', 1", 1''') is condensed near the liquid crystal shutter 7, and goes toward the projection optical unit 2.

In FIGS. 13 and 14, where the vehicle lighting apparatus is a headlight apparatus, when the headlight switch is ON, a high beam of the low/high beam switch is ON, and a non-irradiated object such as a preceding vehicle, an oncoming vehicle or a pedestrian is found by the infrared camera and the radar, the control unit 3 carries out an adaptive driving beam (ADB) control operation. Thus, in a high beam mode, the headlight can be shut or weakened against the irradiated object. Also, when the headlight switch is ON, a low beam of the low/high beam switch is ON, the vehicle speed sensor indicates a low vehicle speed state, and the angle of the steering angle sensor is larger than a predetermined angle, the control unit 3 carries out an adaptive front-lighting system (AFS) control operation. Thus, in a low vehicle speed mode, the near visibility characteristics on the side of the vehicle can be improved, so that a pedestrian or the like would not be caught by the vehicle. Further, when the headlight switch is ON, a high beam of the low/high beam switch is ON, and the vehicle speed sensor indicates a high vehicle speed state, the control unit 3 carries out a high irradiation mode for a far object. Thus, the far visibility characteristics can be improved in a high vehicle speed mode.

The vehicle lighting apparatus can be applied to other vehicle lights such as a tail light in addition to the headlight.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A vehicle lighting apparatus comprising:
an optical source unit comprising,
multiple first optical sources for emitting P-polarized light beams;
multiple first detectors, each for detecting a light emitting state of one of said first optical sources;
a second optical source for emitting a polarized light beam; and
a second detector for detecting a light emitting state of said second optical source;
multiple light beam combining and splitting sections, provided on an output light path of second optical source, each adapted to receive one of said P-polarized light beams,
each of said light beam combining and splitting sections comprising:
a variable polarization element for changing a polarization direction of said polarized light beam or an output light beam of a pre-stage of said each of said light beam combining and splitting sections;
a polarization beam splitter adapted to split an output light beam of said variable polarization element into a P-polarized component and an S-polarized component, said P-polarized component being transmitted to a post stage of said each of said light beam combining and splitting sections or a light shield member,
said polarization beam splitter being further adapted to combine said P-polarized light beam of a corresponding one of said first optical sources and said S-polarized component of said variable polarization element into an output light beam of said optical source unit;
a projection optical unit for receiving said output light beams of said optical source unit to project said output light beams; and
a control unit for controlling said optical source unit,
when said first optical sources are determined to be all normal in accordance with first output signals of said first detectors, respectively, said control unit being adapted to drive all of said first optical sources, so that each of said output light beams of said optical source unit has a predetermined light flux,
when at least one of said first optical sources is determined to be abnormal and said second optical source is determined to be normal in accordance with the first and second output signals of said first and second detectors, respectively, said control unit being adapted to turn off said at least one of said first optical sources, to drive said second optical source unit, and to operate said variable polarization elements of said light beam combining and splitting elements, so that the output light beam of at least one of said light beam combining and splitting sections corresponding to said at least one of said first optical sources has said predetermined light flux.

2. A vehicle lighting apparatus comprising:
an optical source unit comprising,
multiple first optical sources for emitting P-polarized light beams;
multiple first detectors, each for detecting a light emitting state of one of said first optical sources;
a second optical source for emitting a polarized light beam; and
a second detector for detecting a light emitting state of said second optical source;
multiple light beam combining and splitting sections, provided on an output light path of second optical source, each adapted to receive one of said P-polarized light beams,
each of said light beam combining and splitting sections comprising:
a variable polarization element for changing a polarization direction of said polarized light beam or an output light beam of a pre-stage of said each of said light beam combining and splitting sections;
a polarization beam splitter adapted to split an output light beam of said variable polarization element into a P-polarized component and an S-polarized component, said P-polarized component being transmitted to a post stage of said each of said light beam combining and splitting sections or a light shield member,
said polarization beam splitter being further adapted to combine said P-polarized light beam of a corresponding one of said first optical sources and said S-polarized component of said variable polarization element into an output light beam of said optical source unit;
a projection optical unit for receiving said output light beams of said optical source unit to project said output light beams; and
a control unit for controlling said optical source unit,
when said first and second optical sources are determined to be all normal in accordance with first and second output signals of said first and second detectors, respectively, said control unit being adapted to drive all of said first and second optical source units, and to operate said variable polarization elements of said light beam combining and splitting elements, so that each of said output light beam of said light beam combining and splitting elements has a predetermined light flux,
when at least one of said first optical sources is determined to be abnormal and said second optical source is determined to be normal in accordance with the first and second output signals of said first and second detectors, respectively, said control unit being adapted to turn off said at least one of said first optical sources, to drive said second optical source, and to operate said variable polarization elements of said light beam combining and splitting sections, so that said output light beam of at least one of said light beam combining and splitting sections corresponding to said at least one of said first optical sources has said predetermined light flux.

3. A vehicle lighting apparatus comprising:
a two dimensional optical source unit including multiple optical source units comprising,
 multiple first optical sources for emitting P-polarized light beams;
 multiple first detectors, each for detecting a light emitting state of one of said first optical sources;
 a second optical source for emitting a polarized light beam; and
 a second detector for detecting a light emitting state of said second optical source;
 multiple light beam combining and splitting sections, provided on an output light path of second optical source, each adapted to receive one of said P-polarized light beams,
 each of said light beam combining and splitting sections comprising:
  a variable polarization element for changing a polarization direction of said polarized light beam or an output light beam of a pre-stage of said each of said light beam combining and splitting sections;
  a polarization beam splitter adapted to split an output light beam of said variable polarization element into a P-polarized component and an S-polarized component, said P-polarized component being transmitted to a post stage of said each of said light beam combining and splitting sections or a light shield member,
  said polarization beam splitter being further adapted to combine said P-polarized light beam of a corresponding one of said first optical sources and said S-polarized component of said variable polarization element into an output light beam of said optical source units;
a projection optical unit for receiving output light beams of said two-dimensional optical source unit to project said output light beams; and
a control unit for controlling said two-dimensional optical source unit.

4. The vehicle lighting apparatus as set forth in claim 3, further comprising:
a condenser lens adapted to receive said output light beams of said two dimensional optical source unit; and
a digital mirror device controlled by said control unit to transmit output light beams from said condenser lens to said projection optical unit,
said condenser lens and said digital mirror device being provided between said two-dimensional optical source unit and said projection optical unit.

5. The vehicle lighting apparatus as set forth in claim 3, further comprising a liquid crystal shutter, provided between said two-dimensional optical source unit and said projection optical unit and controlled by said control unit to transmit output light beams to said projection optical unit.

6. The vehicle lighting apparatus as set forth in claim 1, further comprising first and second alarms connected to said control unit, said first and second alarms being turned on when said first and second optical sources are determined to be abnormal.

7. The vehicle lighting apparatus as set forth in claim 2, further comprising first and second alarms connected to said control unit, said first and second alarms being turned on when said first and second optical sources are determined to be abnormal.

8. The vehicle lighting apparatus as set forth in claim 3, further comprising first and second alarms connected to said control unit, said first and second alarms being turned on when said first and second optical sources are determined to be abnormal.

* * * * *